United States Patent
Buckbee et al.

(10) Patent No.: US 11,977,186 B2
(45) Date of Patent: May 7, 2024

(54) TOF SYSTEM

(71) Applicant: STMicroelectronics (Research & Development) Limited, Marlow (GB)

(72) Inventors: Kasper Buckbee, Edinburgh (GB); Neale Dutton, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 521 days.

(21) Appl. No.: 17/341,084

(22) Filed: Jun. 7, 2021

(65) Prior Publication Data

US 2022/0390576 A1     Dec. 8, 2022

(51) Int. Cl.
    *G01S 7/4865*     (2020.01)
    *G01C 3/00*     (2006.01)
    (Continued)

(52) U.S. Cl.
    CPC .......... *G01S 7/4865* (2013.01); *G01S 7/4863* (2013.01); *H03M 1/34* (2013.01); *G01C 3/00* (2013.01);
    (Continued)

(58) Field of Classification Search
    CPC .... G01S 7/4865; G01S 7/4863; G01S 7/4914; G01S 7/4915; G01S 17/10; G01S 17/36;
    (Continued)

(56) References Cited

U.S. PATENT DOCUMENTS 6,754,613 B2    6/2004    Tabatabaei et al.
7,868,665 B2    1/2011    Tumer et al.
(Continued)

FOREIGN PATENT DOCUMENTS

EP     2728373 A1     5/2014

OTHER PUBLICATIONS

Rocca et al.("A 128 x 128 SPAD Motion-Triggered Time-of-Flight Image Sensor With In-Pixel Histogram and Column-Parallel Vision Processor," in IEEE Journal of Solid-State Circuits, vol. 55, No. 7, pp. 1762-1775, Jul. 2020, doi: 10.1109/JSSC.2020.2993722.) (Year: 2020).*

(Continued)

*Primary Examiner* — Manish S Shah
*Assistant Examiner* — Christian T Bryant
(74) *Attorney, Agent, or Firm* — Slater Matsil, LLP

(57) ABSTRACT

In an embodiment, a method includes: resetting respective count values of a plurality of analog counters to an initial count value, each analog counter of the plurality of analog counters corresponding to a histogram bin of a time-of-flight (ToF) histogram; after resetting the respective count values, receiving a plurality of digital addresses from a time-to-digital converter (TDC); during an integration period, for each received digital address, selecting one analog counter based on the received digital address, and changing the respective count value of the selected one analog counter towards a second count value by a discrete amount, where each analog counter has a final count value at an end of the integration period; and after the integration period, determining an associated final bin count of each histogram bin of the ToF histogram based on the final count value of the corresponding analog counter.

28 Claims, 19 Drawing Sheets

(51) Int. Cl.
| | |
|---|---|
| *G01C 3/06* | (2006.01) |
| *G01C 3/08* | (2006.01) |
| *G01S 7/4863* | (2020.01) |
| *G01S 7/4914* | (2020.01) |
| *G01S 7/4915* | (2020.01) |
| *G01S 17/10* | (2020.01) |
| *G01S 17/14* | (2020.01) |
| *G01S 17/36* | (2006.01) |
| *G01S 17/894* | (2020.01) |
| *G06T 7/521* | (2017.01) |
| *G06T 7/70* | (2017.01) |
| *H03M 1/34* | (2006.01) |

(52) U.S. Cl.
CPC ............... *G01C 3/06* (2013.01); *G01C 3/08* (2013.01); *G01S 7/4914* (2013.01); *G01S 7/4915* (2013.01); *G01S 17/10* (2013.01); *G01S 17/14* (2020.01); *G01S 17/36* (2013.01); *G01S 17/894* (2020.01); *G06T 7/521* (2017.01); *G06T 7/70* (2017.01)

(58) Field of Classification Search
CPC ........ G01S 17/894; G01S 17/14; H03M 1/34; G01C 3/08; G01C 3/06; G01C 3/00; G06T 7/70; G06T 7/521
See application file for complete search history.

(56) References Cited

U.S. PATENT DOCUMENTS

| | | | |
|---|---|---|---|
| 8,440,957 | B2 | 5/2013 | Dierickx |
| 9,313,434 | B2 | 4/2016 | Dutton et al. |
| 9,380,245 | B1 | 6/2016 | Guidash et al. |
| 9,521,338 | B2 | 12/2016 | Vogelsang et al. |
| 9,639,063 | B2 | 5/2017 | Dutton et al. |
| 10,317,529 | B2 | 6/2019 | Shu et al. |
| 10,976,709 | B1 | 4/2021 | Moore et al. |
| 11,070,754 | B1 | 7/2021 | Zhang et al. |
| 2016/0260203 | A1 | 9/2016 | He et al. |
| 2018/0164415 | A1 | 6/2018 | Buckley et al. |
| 2018/0246212 | A1 | 8/2018 | Moore et al. |
| 2018/0253404 | A1 | 9/2018 | Moore et al. |
| 2019/0018119 | A1 | 1/2019 | Laifenfeld et al. |
| 2019/0129012 | A1 | 5/2019 | Ikuta et al. |
| 2019/0230304 | A1 | 7/2019 | Moore et al. |
| 2020/0182983 | A1* | 6/2020 | Calder ............... G01S 7/4865 |
| 2020/0217965 | A1* | 7/2020 | Calder ................ G01S 7/487 |
| 2020/0233068 | A1* | 7/2020 | Henderson ........... G01S 17/10 |
| 2021/0029320 | A1 | 1/2021 | Janbu et al. |
| 2021/0124032 | A1 | 4/2021 | Moore et al. |
| 2021/0302550 | A1 | 9/2021 | Dutton et al. |

OTHER PUBLICATIONS

Seo et al. ( Histogram-based mixed-signal time-to-digital-converter array for direct time-of-flight depth sensors. Electron. Lett., 55: 310-312. (2019). https://doi.org/10.1049/el.2018.7914) (Year: 2019).*

Dutton, N. et al. "A SPAD-Based QVGA Image Sensor for Single-Photon Counting and Quanta Imaging," The University of Edinburgh, Edinburgh Research Explorer, IEEE Transactions on Electron Devices, vol. 63, Issue 1, Sep. 9, 2015, 9 pages.

Dutton, N. et al., "9.8µm SPAD-based Analogue Single Photon Counting Pixel with Bias Controlled Sensitivity," Jun. 2013, 4 pages.

Electronics Course, "Digital Ramp Analog to Digital Converter (ADC)," electronics-course.com/ramp-adc, May 4, 2021, 3 pages.

Gasparini, L. et al., "Compact time-gated analog counting SPAD-based pixels for high resolution, single-photon, time-resolved imagers," 2015, 4 pages.

Kalisz, J., "Review of methods for time interval measurements with picosecond resolution," Institute of Physics Publishing, Metrologia, Dec. 10, 2003, 16 pages.

Marble, W. J., "Design and Analysis of Charge-Transfer Amplifiers for Low-Power Analog-to-Digital Converter Applications," Brigham Young University, BYU ScholarsArchive, Apr. 29, 2004, 177 pages.

Niclass, C. et al., "A 100-m Range 10-Frames/s 340 x 96-Pixel Time-of-Flight Depth Sensor in 0.18-µm CMOS," IEEE Journal of Solid-State Circuits, vol. 48, No. 2, Feb. 2013, 14 pages.

Panina, E., "Design and Characterization of SPAD Based CMOS Analog Pixels For Photon-Counting Applications," PhD Dissertation, International Doctorate School in Information and Communication Technologies, Jan. 2014, 170 pages.

Perenzoni, M. et al., "A 160 x 120 Pixel Analog-Counting Single-Photon Imager With Time-Gating and Self-Referenced Column Parallel A/D Conversion for Fluorescence Lifetime Imaging," IEEE Journal of Solid-State, Circuits, vol. 51, No. 1, Jan. 2016, 13 pages.

Remondiono, F. et al., "TOF Range-Imaging Cameras," Springer, SPAD-Based Sensors, 2013, 6 pages.

Stoppa, D. et al., "A 32x32-Pixel Array with In-Pixel Photon Counting and Arrival Time Measurement in the Analog Domain," IEEE, Nov. 10, 2009, 4 pages.

Wikipedia, "Charge-transfer amplifier," https://en.wikipedia.org/wiki/Charge-transfer_amplifier, Mar. 2, 2020, 1 page.

Wikipedia, "Counter (digital)," https://en.wikipedia.org/wiki/Counter_(digital)#Asynchronous_(ripple)_counter, Apr. 22, 2021, 7 pages.

* cited by examiner perspective view

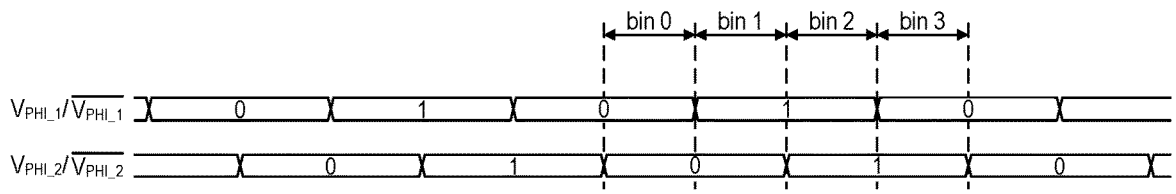
FIG. 23B
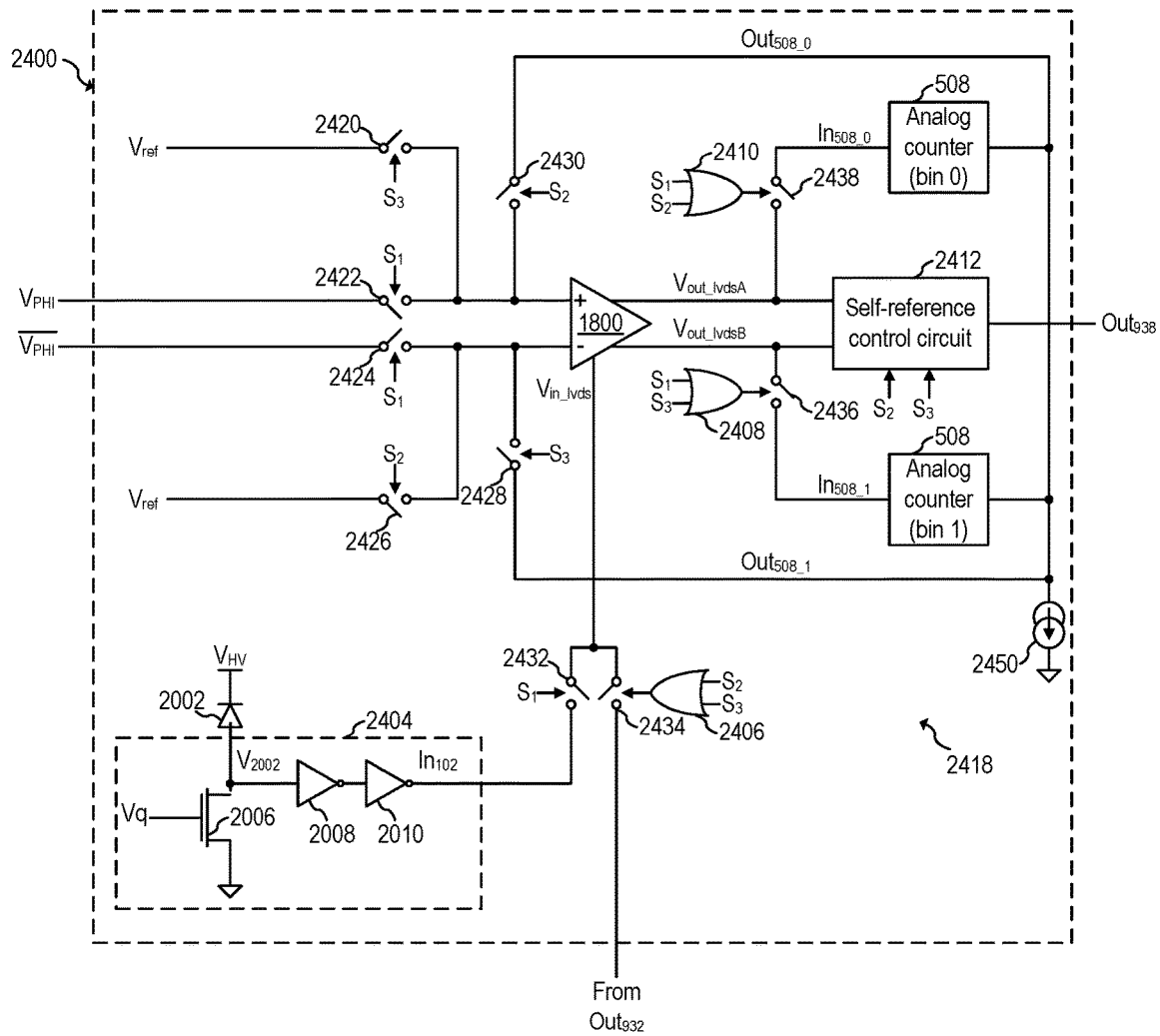
FIG. 24A
FIG. 24B

TOF SYSTEM

TECHNICAL FIELD

The present disclosure relates generally to an electronic system and method, and, in particular embodiments, to a time-of-flight (ToF) system.

BACKGROUND

Devices for determining the distance (or range) to objects are known. One method used for determining the distance to objects is called time-of-flight (ToF). This method comprises sending a light signal towards an object and measuring the time taken by the signal to travel to the object and back. The calculation of the time taken by the signal for this travel may be obtained by measuring the time difference between the signal coming out of the light source and the signal reflected from the object and detected by a light sensor. Knowing this time difference and the speed of light enables the determination of the distance to the object.

Single photon avalanche diodes (SPAD) may be used as a detector of reflected light. In general, an array of SPADs is provided as a sensor in order to detect a reflected light pulse. A photon may generate a carrier in the SPAD through the photo electric effect. The photo generated carrier may trigger an avalanche current in one or more of the SPADs in an SPAD array. The avalanche current may signal an event, namely that a photon of light has been detected.

A time to digital converter (TDC) may be used to calculate the time difference between the time of emission of light and the time of arrival of the reflected light to obtain a distance to an object.

The detector (e.g., the SPAD array) is configured to generate many fast readings in a short time period. Thus, it is common to generate a histogram of detected events (e.g., received photons) in which the detected event arrival times are quantized in histogram bins that may be post-processed to identify the position/distance of multiple targets within the field-of-view (FoV) of the detector.

Direct ToF (DTOF) image sensors use ToF techniques to determine distance towards a target to provide, e.g., 3D-depth maps. A DTOF image sensor generally includes an image capture mechanism, data converter(s), and timing generation circuits.

SUMMARY

In accordance with an embodiment, a method includes: resetting respective count values of a plurality of analog counters to an initial count value, each analog counter of the plurality of analog counters corresponding to a histogram bin of a time-of-flight (ToF) histogram; after resetting the respective count values of the plurality of analog counters, receiving a plurality of digital addresses from a time-to-digital converter (TDC), the TDC having an input coupled to a single photon avalanche diode (SPAD); during an integration period, for each received digital address of the plurality of digital addresses, selecting one analog counter of the plurality of analog counters based on the received digital address, and changing the respective count value of the selected one analog counter towards a second count value by a discrete amount, the second count value being different than the initial count value, where each analog counter has a final count value at an end of the integration period; and after the integration period, determining an associated final bin count of each histogram bin of the ToF histogram based on the final count value of the corresponding analog counter.

In accordance with an embodiment, a time-of-flight (ToF) system includes: a plurality of single photon avalanche diodes (SPADs) configured to generate SPAD events; a plurality of time-to-digital converters (TDCs) coupled to the plurality of SPADs, where each TDC of the plurality of TDCs is configured to generate digital addresses based on SPAD events generated by an associated SPAD of the plurality of SPADs; a plurality of histogram generation circuits, each histogram generation circuit of the plurality of histogram generation circuits coupled to a respective TDC of the plurality of TDCs, where each histogram generation circuit includes: an addressing logic circuit having a plurality of outputs, and an input configured to receive digital addresses from the respective TDC, a plurality of analog counters, where each analog counter of the plurality of analog counters includes an input coupled to a respective output of the plurality of outputs of the addressing logic circuit, where each analog counter includes an associated storage capacitor; and an analog-to-digital converter (ADC) coupled to the plurality of analog counters, where: each histogram generation circuit is configured to reset a voltage of the associated storage capacitor of each analog counter to a first voltage, the addressing logic circuit is configured to, during an integration period after the resetting of the plurality of analog counters, select, for each received digital address, one analog counter of the plurality of analog counters based on the received digital address, and assert the input of the selected one analog counter, where the selected one analog counter is configured to change a voltage of the associated storage capacitor of the selected one analog counter towards a second voltage by a discrete voltage when the input of the selected one analog counter is asserted, where the associated storage capacitor of each analog counter is configured to have a final voltage at an end of the integration period, and the ADC is configured to convert the final voltage of the associated storage capacitor of each analog counter to a corresponding digital count, where each digital count is associated with a histogram bin of a ToF histogram, and where an associated final bin count of each histogram bin of the ToF histogram is based on the associated digital count.

In accordance with an embodiment, a time-of-flight (ToF) system includes: a single photon avalanche diodes (SPAD) array including an array of pixels, each pixel of the array of pixels including a SPAD and a SPAD front-end circuit; a plurality of time-to-digital converters (TDCs) coupled to respective SPADs of the SPAD array, where each TDC of the plurality of TDCs is configured to generate digital addresses based on SPAD events generated by the respective SPAD, where each digital address of the digital addresses includes m bits, m being a positive integer greater than or equal to 1; a plurality of histogram generation circuits, each histogram generation circuit of the plurality of histogram generation circuits including: an addressing logic circuit having n outputs, and an input configured to receive digital addresses from the respective TDC, n analog counters, n being equal to $2^m$, where each analog counter of the n analog counters includes an input coupled to a respective output of the n outputs of the addressing logic circuit, where each analog counter includes an associated storage capacitor, n first logic gates, each of the n first logic gates having a first input respectively coupled to the n outputs of the addressing logic circuit, and a pulse control circuit having an output coupled to a second input of each of the n first logic gates; and an analog-to-digital converter (ADC) coupled to the n of analog counters.

BRIEF DESCRIPTION OF THE DRAWINGS

For a more complete understanding of the present invention, and the advantages thereof, reference is now made to the following descriptions taken in conjunction with the accompanying drawings, in which:

FIG. 23B shows a timing diagram illustrating differential signals received by the pixel of FIG. 23A, according to an embodiment of the present invention;

FIG. 24A shows a pixel, according to an embodiment of the present invention;

FIG. 24B illustrates the state of switches of FIG. 24A for different modes of operation of the pixel of FIG. 24, according to an embodiment of the present invention.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
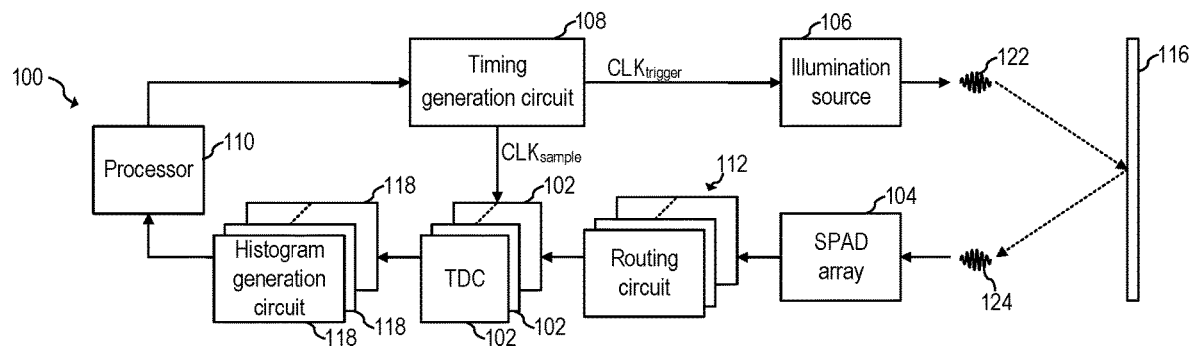
FIG. 1 shows a time-of-flight (ToF) imaging system, according to an embodiment of the present invention.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a ToF system including a ToF histogram generation circuit using charge transfer amplifier (CTA)-based analog counters, and a SPAD array that includes a plurality of SPAD sensor pixels. Embodiments of the present invention may be used with other types of analog counters, other types of ToF sensors, and/or other types of ToF pixel designs. Some embodiments may be implemented in other types of applications, such as applications that may benefit from CTA-based analog counters and/or a SPAD sensor pixels.

In an embodiment of the present invention, a plurality of analog integrators is used to determine and store histogram bin counts based on associated SPAD events from one or more SPADs. Digital addressing (e.g., using a decoder) based on an output from a TDC is used to select which analog integrator (histogram bin) to increment. A (e.g., shared) analog-to-digital converter (ADC) is used to read the bin count from each of the analog integrators associated with the one or more SPADs. In some embodiments, the analog integrators operating as analog counters are implemented in-pixel. In some embodiments, the analog counter is implemented with a charge transfer amplifier (CTA).

By using digital addressing, some embodiments are advantageously capable of achieving histogram generation speeds using analog counters that are similar to the histogram generation speeds achieved in implementations relying on SRAM or parallelized counters. In some embodiments, the use of analog counters may advantageously allow for lower power operation and/or lower area when compared to implementations relying on SRAM or parallelized counters.

In some embodiments, the (e.g., shared) ADC uses a self-reference ramp generated in cooperation with an analog integrator to determine the bin count of the analog integrator. In some embodiments, using a self-referenced ADC may advantageously improve linearity, achieve greater count range (e.g., by allowing for a smaller step size $\Delta V$), reduce noise, and achieve good matching between histogram bins, e.g., when compared to implementations that do not use a self-referenced ADC.

In some embodiments, low-voltage digital signaling (LVDS) latches are used for clock distribution of a ToF system. In some embodiments, using LVDS latches for clock distribution advantageously allows for clock propagation with low power consumption and/or zero quiescent current in-pixel.

In some embodiments, a TDC may be implemented with one or more LVDS latches. In some embodiments, an LVDS latch may simultaneously operate as a TDC and as a decoder for digital addressing of the plurality of analog counters and/or as comparator of the self-referenced ADC. In some embodiments, reusing the LVDS latch for receiving clock signals, perform TDC operations, digital addressing operations, and/or comparator operations for a self-referenced ADC may advantageously allow low power and small implementations histogram generation and readout circuits. In some embodiments, part or all of the histogram generation circuit may be implemented in-pixel.

Additional advantages of some embodiments include achieving a ToF system with small area and low power ToF pixels by using LVDS latches and CTA-based analog counters. Some embodiments may achieve small area and low power pixel design in ToF systems using large ToF sensor arrays (e.g., SPAD arrays), such as larger than 1 megapixels.

Optical ranging devices using ToF techniques rely on detecting returned signal from objects (targets) in their field-of-view (FoV) to determine the range of these objects from the ranging device. FIG. 1 shows ToF system (e.g., DTOF system) 100, according to an embodiment of the present invention. ToF system 100 includes illumination source 106, SPAD array 104, a plurality of TDCs 102, a plurality of histogram generation circuits 118, processor 110, and timing generation circuit 108. Routing circuits 112 couple SPADs of SPAD array 104 to TDCs 102 (e.g., via metal traces and/or logic circuit(s)).

During normal operation, illumination source 106 emits light pulses 122 towards object 116, e.g., at times controlled by timing generator circuit 108. Reflected light pulses 124 are sensed by SPAD array 104 and routed to TDCs 102 by routing circuits 112. TDCs 102 generate digital representations of the time between the emissions of light pulses 122 and receptions of reflected light pulses 124. Histogram generation circuits 118 generate ToF histograms based on the outputs of TDCs 102. Processor 110 then processes the ToF histograms, e.g., in a known manner, e.g., to determine the distance to object 116 and/or generate a 3D-depth map.

A ToF histogram may be understood as a histogram having bins corresponding to different times from emission of a light pulse (e.g., 122). Generally, lower bins (e.g., decimal bins 1 and 2, or equivalently binary bins 00 and 01) correspond to shorter times (and therefore closer targets), while higher bins (e.g., decimal bins 9 and 10, or equivalently binary bins 1001 and 1010) correspond to longer times (and therefore farther targets). In some embodiments, ToF histograms with a plurality of bins (e.g., 4, 8, 64, 128, or more bins) allow for DTOF operation, e.g., where a pulsed light source (e.g., 106) is used and distance to a target (or targets) is calculated directly based on the peak (or peaks) of the ToF histogram.

Illumination source 106 may be implemented in any way known in the art. For example, illumination source 106 may be implemented as a vertical-cavity surface-emitting laser (VCSEL). Other implementations are also possible.

Processor 110 may be implemented as a general purpose digital signal processor (DSP), processor or controller that includes, for example, combinatorial circuits coupled to a memory. For example, in some embodiments, processor 110 is configured to execute instructions stored in the memory. Processor 110 may also be implemented as a custom application-specific integrated circuit (ASIC). Other implementations are also possible.

In some embodiments, timing generation circuit 108 generates a, e.g., periodic, signal $CLK_{trigger}$ to trigger illumination source 106 to emit light pulses 122. In some embodiments, timing generation circuit 108 also provides signal $CLK_{sample}$ indicative of the time of emission of light pulses 122 to TDCs 102, e.g., to be used as a reference signal. In some embodiments, signal $CLK_{sample}$ may include a plurality of out-of-phase clock signals. For example, in some embodiments, m clock signals, such as m out-of-phase differential clock signals, may be provided to TDCs 102, wherein TDCs 102 are configured to generate an m-bit digital address. In some embodiments, signal $CLK_{sample}$ may carry data associated with a timestamp. Timing generation circuit 108 may be implemented in any way known in the art.

TDC 102 generates an output indicative of the time between a reference time (e.g., given by signal $CLK_{sample}$) and an event time (e.g., the time of activation of a SPAD). In some embodiments, TDC 102 may be implemented in any way known in the art. For example, TDC 102 may be implemented using a plurality of flip-flops that update their state based on one or more reference clocks, and determines a time between a SPAD event and a reference based on the state of the flip-flops at the time in which the SPAD event is received by the plurality of flip-flops. In some embodiments, a plurality of out-of-phase clocks is used by the TDC to update the state of the flip-flops of the TDC. Other implementations are also possible.

Figure 2:
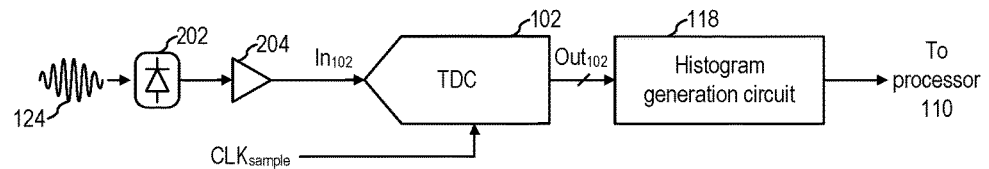
FIGS. 2 and 3 show schematic diagrams of possible implementations of the coupling of a TDC of FIG. 1 and the corresponding histogram generation circuit of FIG. 1 to the SPAD array of FIG. 1, according to embodiments of the present invention.
Figure 3:
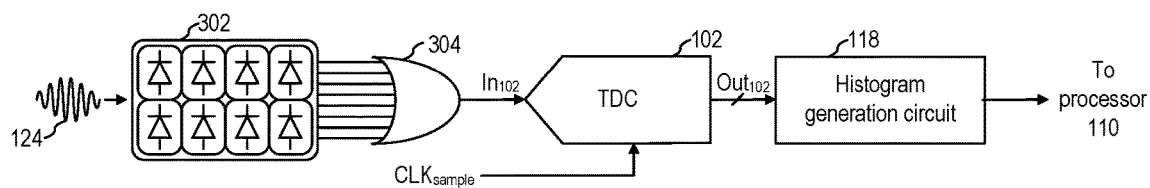

SPAD array 104 may include a plurality of pixels, e.g., arranged in rows and columns, where each pixel includes one or more SPADs (e.g., 202, 302, 2002, as illustrated in FIGS. 2, 3, and 20, respectively), and a SPAD front-end circuit (e.g., 2004, 2404, as illustrated in FIGS. 20 and 24, respectively). Other implementations are also possible.

As will be described in more detail later, in some embodiments, a TDC and a histogram generation circuit may be implemented inside a pixel of a SPAD array. In some embodiments, a TDC may be part of the histogram generation circuit.

In some embodiments, each SPAD of SPAD array 104 is coupled to a corresponding TDC 102. In some embodiments, a plurality of SPADs share the same TDC 102 via, e.g., an OR tree. For example, FIGS. 2 and 3 show schematic diagrams of possible implementations of the coupling of a TDC 102 and the corresponding histogram generation circuit 118 to SPAD array 104, according to embodiments of the present invention.

As shown in FIG. 2, in some embodiments, each pixel of SPAD array 104 includes a single SPAD 202, and each TDC 102 may be coupled to a single SPAD 202 via one or more buffers 204 (where buffer 204 is part of routing circuits 112). In some embodiments, one or more inverters may be used instead of or in addition to the one or more buffers 204.

As shown in FIG. 3, in some embodiments, each pixel of SPAD array 104 includes a plurality of SPADs 202 and each TDC 102 may be coupled to a plurality of SPADs 302 via OR tree 304 (where OR tree 304 is part of routing circuits 112). Different number of SPADs may be used for each pixel of SPAD array 104, such as 2, 4, 6, 10, 16, or other.

Figure 4:
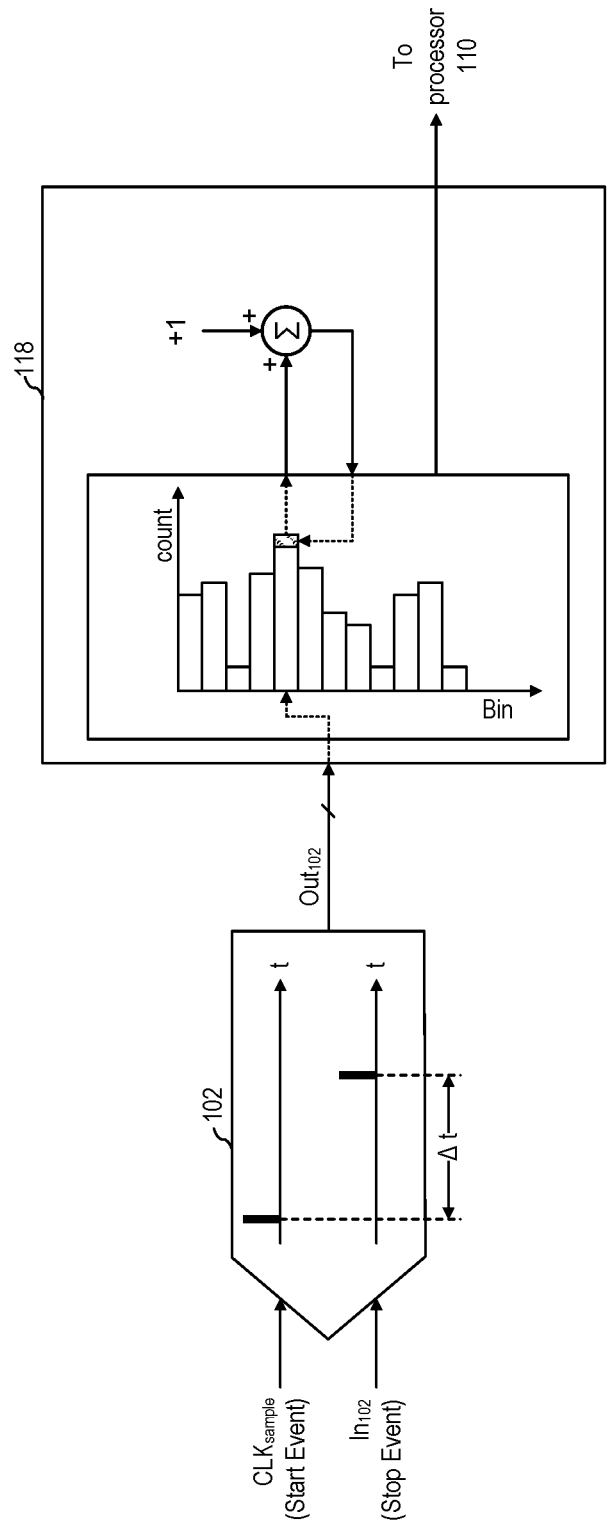
FIG. 4 shows a diagram illustrating a process of ToF histogram generation based on ToF measurements of the ToF imaging system of FIG. 1, according to an embodiment of the present invention.

Histogram generation circuit 118 is configured to generate a ToF histogram based on the output of a corresponding TDC 102. For example, FIG. 4 shows a diagram illustrating a process of ToF histogram generation based on ToF measurements of ToF system 100, according to an embodiment of the present invention.

During normal operation, for each emitted light pulse 122, TDC 102 measures the time $\Delta t$ between the emitted light pulse 122 (e.g., based on signal $CLK_{sample}$) and received reflected light pulse 124 (e.g., based on TDC input signal $In_{102}$) and sends digital code $Out_{102}$ indicative of the time $\Delta t$ to histogram generation circuit 118. Histogram generation circuit 118 receives digital code $Out_{102}$ and increments the histogram bin associated with the digital code $Out_{102}$. As it will be described in more detail later, the histogram bins and the incrementing of the histogram bins may be implemented with analog counters.

In some embodiments, digital code $Out_{102}$ may be, e.g., a 7-bit word. In some embodiments, digital code $Out_{102}$ may be implemented with less than 7 bits, such as 6 bits, 4 bits, or less, or with more than 7 bits, such as with 8 bits or more. Digital code $Out_{102}$ may also be referred to as digital address $Out_{102}$.

In some embodiments, digital code $Out_{102}$ uses binary coding such that digital code $Out_{102}$ corresponds to a binary address of a histogram bin. For example, when digital code $Out_{102}$ is 10, bin 2 is incremented, when digital code $Out_{102}$ is 101, bin 5 is increment, etc. Other implementations are also possible.

Histogram generation may be performed on-chip (e.g., in the same integrated circuit as the image sensor, such as a SPAD array, is located) or off-chip (e.g., in a circuit external to the integrated circuit that includes the image sensor). Off-chip histogram generation may advantageously allow for using fast, powerful processors for generating the ToF histogram. On-chip histogram generation may advantageously avoid outputting event signals (e.g., SPAD events) or raw TDC data from each pixel (e.g., SPAD or group of SPADs) of the image sensor, which may advantageously reduce output data rates and lower power consumption. For example, in some embodiments, on-chip implementation of histogram generation may achieve data compression rate that is proportional to the amount of data being generated. For example, in some embodiments, on-chip implementation of histogram generation may achieve data compression ratio of $\text{Num\_TDC\_Timestamps} \cdot \text{TDC\_bit\_depth}$ to $\text{num\_bins} \cdot 2^{bit\_depth\_per\_bin}$, where Num_TDC_Timestamps represents the number of timestamps for the TDCs 102, TDC_bit_depth represents the bit depths of the TDCs 102, bit_depth_per_bin represents the bit depth per bin of the histograms generated by histogram generation circuit 118, and num_bins represents the number of bins of the histograms generated by histogram generation circuit 118. For example 1024 photons triggering an 8b TDC time stamp (for external processing) and an 8b TDC plus histogram with 256 bins at 8b per bin may cause (1024×8=) 8192 b transmitted at very high frequency for external processing (during the integration time when illumination source 106 is triggering) versus (256×8=) 2048 b for the histogram transmitted at low frequency after the integration time for internal on-chip histogram, thereby resulting in a compression ratio of 4 in this example. The compression ratio may be higher than 4. For example, in some embodiments, on-chip implementation of histogram generation may achieved about 256× data compression (data outputted from histogram generation circuits 118) or more versus outputting raw TDC data.

In some embodiments, SPAD array 104, routing circuits 112, TDCs 102, and histogram generation circuits 118 may be implemented in the same integrated circuit (IC). In some embodiments, the same IC also includes illumination source 106 and timing generation circuit 108, and/or part or all of processor 110. In some embodiments, TDCs 102 and histogram generation circuits 118 are disposed adjacent to SPAD array 104. In some embodiments, a ToF system may include TDCs 102 and histogram generation circuits 118 disposed inside a SPAD array. For example, in some embodiments, each pixel of the SPAD array has a corresponding TDC 102 and histogram generation circuit 118. Other implementations are also possible.

Figure 5:
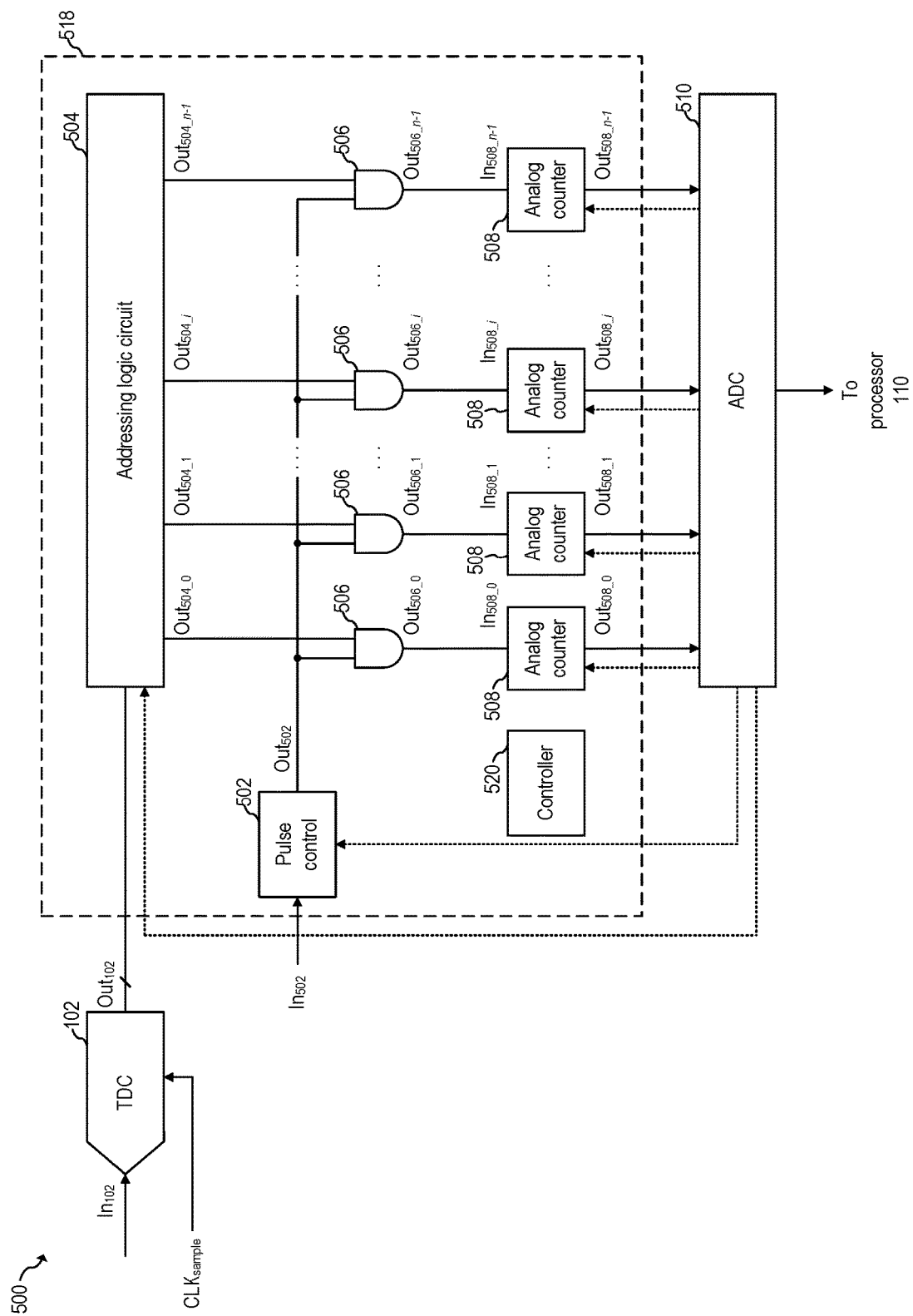
FIG. 5 shows a schematic diagram of a portion of a ToF system illustrating a histogram generation circuit, according to an embodiment of the present invention.

FIG. 5 shows a schematic diagram of a portion of ToF system 500 illustrating histogram generation circuit 518, according to an embodiment of the present invention. ToF system 100 may be implemented as ToF system 500. Each histogram generation circuit 118 may be implemented as histogram generation circuit 518.

During normal operation, in response to the activation of TDC input signal $In_{102}$ (e.g., signal $In_{102}$ pulsing), TDC 102 sends digital code $Out_{102}$ to addressing logic circuit 504 and input signal $In_{502}$ is also activated. In response to receiving digital code $Out_{102}$, addressing logic circuit 504 activates the one of its n outputs that corresponds to the digital code $Out_{102}$, where the digital code $Out_{102}$ has $\log_2 n$ bits. For example, in an embodiment in which n is equal to 128, the digital code $Out_{102}$ has $\log_2 128 = 7$ bits, and each of the possible codes of digital code $Out_{102}$ activates a unique output $Out_{504}$. For example, in some embodiments, when digital code $Out_{102}$ is equal to 0, only output $Out_{504\_0}$ is activated, when digital code $Out_{102}$ is equal to 1, only output $Out_{504\_1}$ is activated, etc.

In response to the activation of input $In_{502}$, pulse control circuit 502 activates output $Out_{502}$. Thus, AND gates 506 all receive a 1 in its first input when output $Out_{502}$ is activated, but only one of the AND gates 506 (the AND gate 506 corresponding to the output $Out_{504}$ that corresponds to the digital code $Out_{102}$) receives a 1 in its second input. As a result, only one of the n analog counters 508 is incremented.

In some embodiments, analog counter 508 is configured to change (e.g., increment or decrement) an internal voltage by a quantized (e.g., fixed discrete) amount (e.g., $\Delta V$) each time input $In_{508}$ is activated. Thus, in some embodiments, each of the n analog counters 508 serves as storage for a respective histogram bin (of n histogram bins), e.g., where the value is stored in a voltage (e.g., in a capacitor) of analog counter 508.

The counts stored in analog counter 508 may be read by using an analog-to-digital converter (ADC). For example, some embodiments may use a single shared ADC 510 to read (e.g., sequentially) the voltages (e.g., of respective capacitors) from each of the n analog counters 508, where the read voltage is indicative of a count of a respective histogram bin. By sharing a single ADC for measuring each of the voltages from each of the n analog counters 508, some embodiments advantageously reduce or minimize measurement differences between different histogram bins (e.g., reduce errors associated with offset and fixed-pattern noise for the difference pixels), which may advantageously result in histogram bins of the same (or approximately the same) size, when compared to using multiple ADCs.

Addressing logic circuit 504 may be implemented as a conventional 1-of-n decoder, in which a single "hot" output is activated based on the digital code $Out_{102}$, while the rest of the outputs of the decoder remain deactivated. For example, in embodiments in which the digital code $Out_{102}$ is a 7-bit word, addressing logic circuit 504 may be implemented as a 1-of-128 decoder having 128 outputs respectively coupled to 128 AND gates 506. Other implementations are also possible.

Pulse control circuit 502 is configured to activate output $Out_{502}$ in synchronization with addressing logic circuit 504. For example, in some embodiments, pulse control circuit 502 may include a delay circuit that activates output $Out_{502}$ a delay time after input $In_{502}$ is activated such that output $Out_{502}$ is activated simultaneously or shortly after addressing logic circuit 504 activates the output $Out_{504}$ corresponding to digital code $Out_{102}$.

In some embodiments, pulse control circuit 502 may be implemented with an inverter chain (e.g., 4 inverters chain-connected). In some embodiments, one or more inverters of the inverter chain may have a loaded input (e.g., by a capacitor). In some embodiments, multiple inverter chains may be chain-connected to achieve a desired delay. Other implementations, such as using other circuits for generating a delay, may also be used to implement pulse control circuit 502.

In some embodiments, input $In_{502}$ may be generated based on input $In_{102}$. For example, in some embodiments, $In_{502}$ may be identical to $In_{102}$. In some embodiments, input $In_{502}$ may be generated based on digital output $Out_{102}$. For example, in some embodiments, $In_{502}$ may be activated in response to digital output $Out_{102}$ being updated. In some embodiments, input $In_{502}$ may be generated based on an addressing logic circuit trigger used to trigger the addressing logic circuit 504 to update its outputs $Out_{504}$ based on code $Out_{102}$. Other implementations are also possible.

Figure 6:
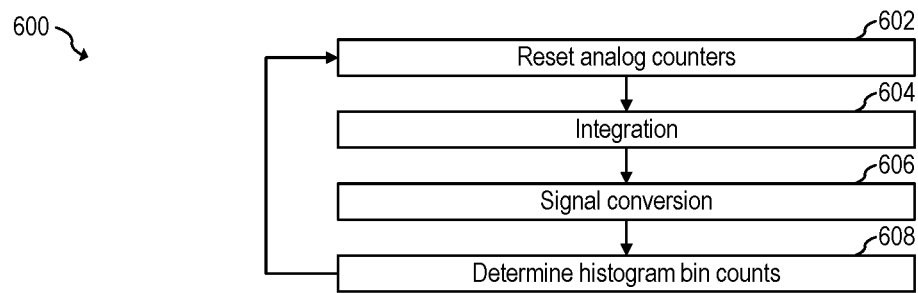
FIGS. 6 and 7 show flow charts of embodiment methods for generating and reading a ToF histogram, according to embodiments of the present invention.

FIG. 6 shows a flow chart of embodiment method 600 for generating and reading a ToF histogram, according to an embodiment of the present invention. ToF system 100 and 500 may implement method 600.

During step 602, analog counters (e.g., 506) are reset. For example, in some embodiments in which the analog counters are decremented each time their respective input (e.g., $In_{508}$) is activated, resetting the analog counters includes setting internal voltages used to store the counts of each analog counter to a full-scale value. In some embodiments in which the analog counters are incremented each time their respective input (e.g., $In_{508}$) is activated, resetting the analog counters includes setting internal voltages used to store the counts of each analog counter to a minimum value (e.g., 0 V). In some embodiments, all of the n analog counters (e.g., 508) are reset simultaneously (in parallel). In some embodiments, resetting the analog counters may take 100 ns. Other durations such as lower than 100 ns (e.g., 90 ns 50 ns, or lower), or higher than 100 ns (e.g., 200 ns or higher), may also be used.

In some embodiments, a controller (e.g., 520) is used to provide a signal to the analog counters to cause a reset of the analog counters. In some embodiments, controller 520 may be implemented using logic circuits, and may include, e.g., a state machine.

During step 604, histogram bins of a ToF histogram (e.g., 118) are incremented based on a sequence of digital codes (e.g., $Out_{102}$) received from a TDC (e.g., 102) in a process referred to as integration. For example, in some embodiments, a single input $In_{508}$ of the n inputs $In_{508}$ is activated per digital code $Out_{102}$ received. Each time an input $In_{508}$ is activated, the corresponding analog counter 508 changes (e.g., increments or decrements) its internal voltage by a quantized value (e.g., $\Delta V$). In some embodiments, the integration process may last a fixed amount of time, such as 100 ns. Longer integration times, such as 200 ns, 1 ms, or longer, or shorter integration times, such as 90 ns, 50 ns, or lower, may also be used. In some embodiments, the integration phase occurs at the same time for all of the n analog counters (e.g., 508).

After the interrogation process finishes, the internal voltages of each analog counter are measured (e.g., sequentially), e.g., by a (e.g., shared) ADC (e.g., 510), or the count associated to each internal voltage is determined, during step 606. During step 608, a histogram bin count associated with each analog counter is determined based on the measured voltage or the measured count. In some embodiments in which each analog counter (e.g., 506) is incremented when its respective input (e.g., $In_{506}$) is activated, the voltage measured by the ADC is directly related to the count of the analog counter. In some embodiments in which each analog counter (e.g., 506) is decremented when its respective input (e.g., $In_{506}$) is activated, the voltage measured by the ADC is related to the full-scale minus the count of the analog counter. For example, if it takes 100 activations of input $In_{506}$ to go from a full-scale internal voltage to a minimum internal voltage, and the voltage measured by the ADC correspond to 60 (remaining) activations, then the count stored in analog counter is 100−60=40 (since it takes 40 activations to go from 100 to 60).

In some embodiments, a (e.g., shared) self-referenced ADC is used to measure the final count of each analog counter (e.g., during step 606) and the full-scale count of each counter. By using a self-referenced ADC, some embodiments advantageously mitigate the effects of quantization steps of varying size within the same analog counter, as well as between analog counters.

Figure 7:
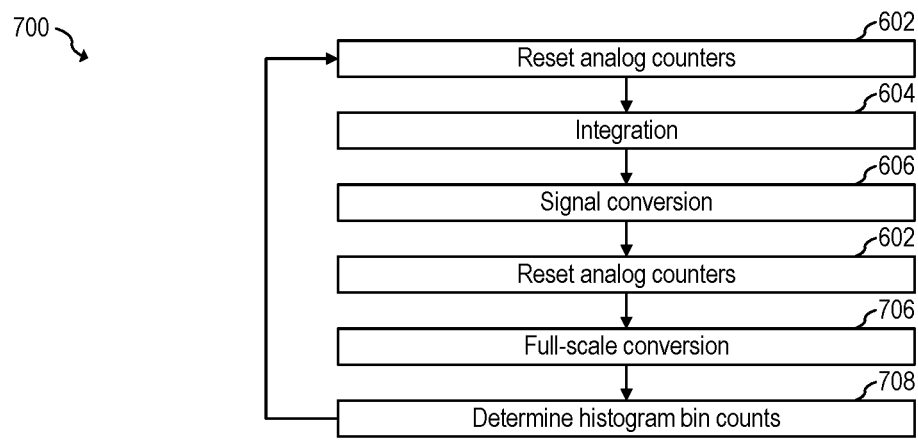

FIG. 7 shows a flow chart of embodiment method 700 for generating and reading a ToF histogram, according to an embodiment of the present invention. ToF system 100 and 500 may implement method 700. Method 700 includes steps 602, 604, 606, 706, and 708. Methods 602, 604, and 606, may be performed in a similar manner is in method 600.

As shown in FIG. 7, after signal conversion (step 606) is performed, the analog counters are reset again during step 602. After resetting the analog counters, a full-scale conversion is performed during step 706. For example, in some embodiments, for each analog counter 506, the input $In_{502}$ is activated a plurality of times until the internal voltage of the analog counter reaches a predetermined threshold.

In some embodiments, the count associated with the signal conversion (e.g., step 606) of an analog counter (e.g., 506) and the count associated with the full-scale conversion (e.g., 706) of the same analog counter may be used to determine the histogram bin count during step 708. For example, in some embodiments, for a decrementing analog counter (e.g., 506), the ADC (e.g., 510) may measure during step 606 the number of activations remaining $Cnt_{remain}$ (starting from the voltage at the end of the integration process) to reach a predetermined minimum voltage, and may measure during step 706 the total number of activations $Cnt_{full-scale}$ to reach the predetermined minimum voltage when starting from the full-scale voltage. In some such embodiments, the histogram bin count $Cnt_{bin}$ may be given by $$Cnt_{bin} = Cnt_{full-scale} - Cnt_{remain} \qquad (1)$$

In some embodiments, for an incrementing analog counter (e.g., 506), the ADC (e.g., 510) may measure during step 606 the number of activations remaining $Cnt_{remain}$ (starting from the voltage at the end of the integration process) to reach the full-scale voltage, and may measure during step 706 the total number of activations $Cnt_{full-scale}$ to reach the full-scale voltage when starting from the predetermined minimum. In some such embodiments, the histogram bin count $Cnt_{bin}$ may be given by Equation 1.

Figure 8:
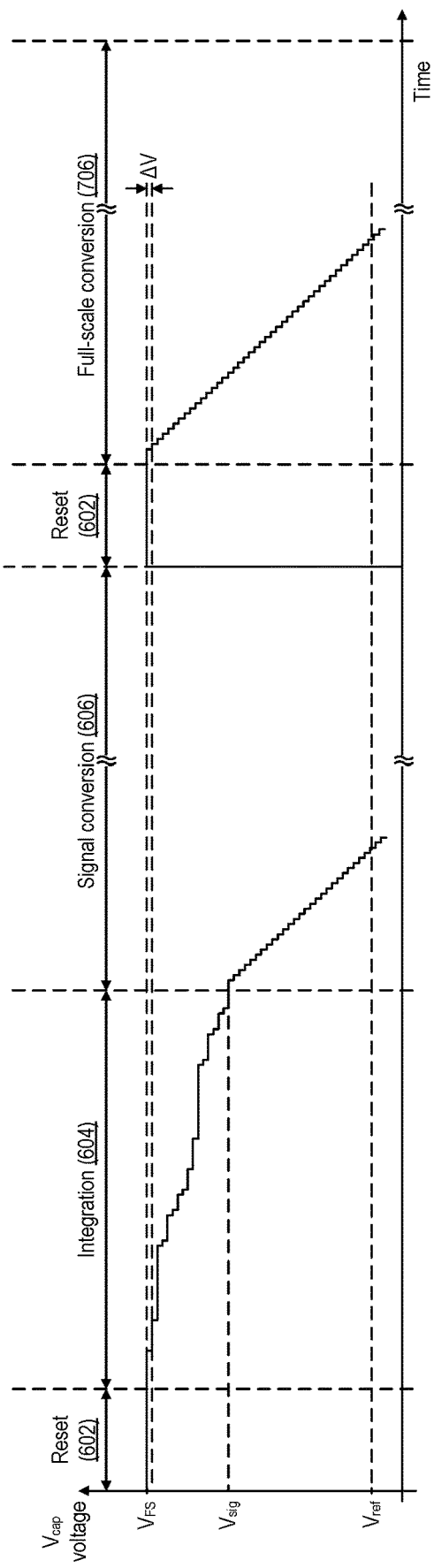
FIG. 8 shows a timing diagram of a decrementing analog counter during performance of the method of FIG. 7, according to an embodiment of the present invention.

FIG. 8 shows a timing diagram of a decrementing analog counter (e.g., 506) during performance of method 700, according to an embodiment of the present invention. FIG. 8 illustrates the internal voltage $V_{cap}$ of one of the n analog counters (e.g., 506). FIG. 8 may be understood in view of FIG. 7.

As shown in FIG. 8, an internal voltage $V_{cap}$ is reset to the full-scale voltage $V_{FS}$ during step 602. In some embodiments, all of the n analog counters (e.g., 508) are reset simultaneously (not shown in FIG. 8).

During the integration phase (step 604), the voltage $V_{cap}$ is decrement by a quantized value ($\Delta V$) each time the input signal $In_{508}$ is activated. At the end of the integration phase, the voltage $V_{cap}$ is equal to $V_{sig}$. As shown in FIG. 8, voltage $V_{sig}$ is indicative of the number of times the voltage $V_{cap}$ is decremented (which is equal to the number of times input signal $In_{508}$ is activated). In some embodiments, the integration phase occurs at the same time for all of the n analog counters (not shown in FIG. 8).

During the signal conversion phase (606), input signal $In_{508}$ is activated (e.g., by a state machine) until voltage Vcap reaches a reference voltage $V_{ref}$. In some embodiments, $V_{ref}$ is equal to 0.5 V. Other voltages, such as higher than 0.5 V (e.g., 0.55 V, 0.6 V or higher), or lower than 0.5 V (e.g., 0.4 V, or lower) may also be used for voltage $V_{ref}$. A counter, such as a ripple counter, may be used to count the number of times ($Cnt_{remain}$) that input signal $In_{508}$ is activated for voltage $V_{cap}$ to reach $V_{ref}$ from $V_{sig}$.

In some embodiments, the signal conversion step (606) is performed sequentially for each analog counter 508. Thus, in some embodiments, once the count $Cnt_{remain}$ is determined for a particular analog counter, the signal conversion step is performed for the next counter, until the count $Cnt_{remain}$ is determined for all n analog counters.

After the signal conversion step 606 is performed (e.g., for all analog counters), the voltage $V_{cap}$ is reset to the full-scale voltage $V_{FS}$. During the full-scale conversion phase (706), input signal $In_{508}$ is activated (e.g., by a state machine) until voltage $V_{cap}$ reaches a reference voltage $V_{ref}$. A counter, such as the same ripple counter used during the signal conversion phase 606, may be used to count the number of times ($Cnt_{full-scale}$) that input signal $In_{508}$ is activated for voltage $V_{cap}$ to reach $V_{ref}$ from $V_{FS}$.

In some embodiments, the signal conversion step (706) is performed sequentially for each analog counter 508. Thus, in some embodiments, once the count $Cnt_{fun-scale}$ is determined for a particular analog counter, the signal conversion step is performed for the next counter, until the count $Cnt_{full-scale}$ is determined for all n analog counters.

Figure 9:
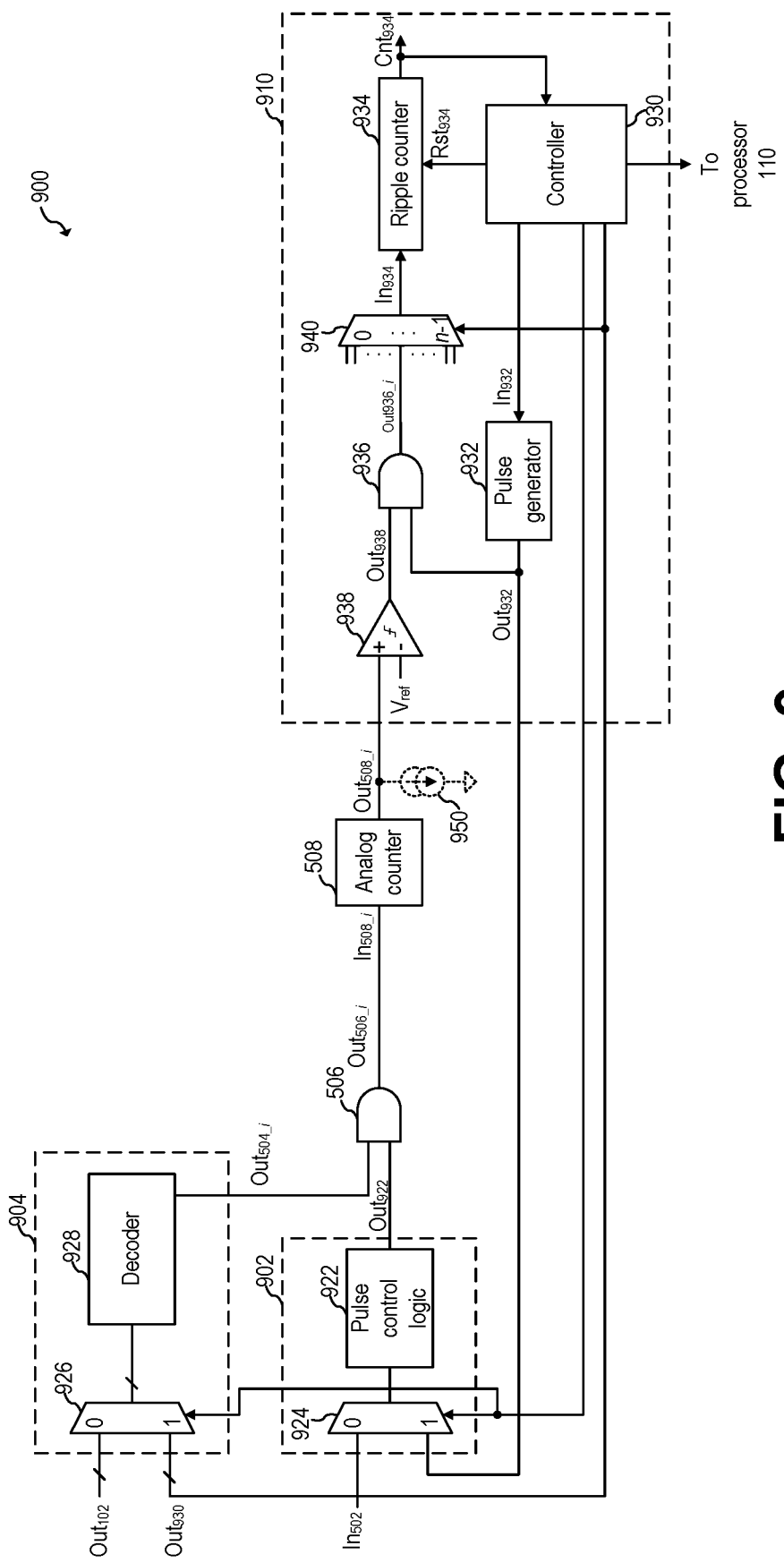
FIGS. 9 and 10 show schematic diagrams of portions of ToF systems illustrating the analog-to-digital converter (ADC) of FIG. 5, according to embodiments of the present invention.

In some embodiments, ADC 510 causes a particular input signal $In_{508}$ of a particular analog counter 508 to activate multiple times during the signal conversion phase (606) and during the full-scale conversion phase (706) by controlling pulse control circuit 502 and addressing logic circuit 504. For example, FIG. 9 shows a schematic diagram of a portion of ToF system 900 illustrating ADC 910, according to an embodiment of the present invention. ToF system 500 may be implemented as ToF system 900. ADC 510 may be implemented as ADC 910. Addressing logic circuit 504 may be implemented as addressing logic circuit 904. Pulse control circuit 502 may be implemented as pulse control circuit 902.

FIG. 9 illustrates the circuits associated with a single analog counter 508 (e.g., counter 508_i) of the n analog counters 508, where the ith analog counter 508 may be any of the n analog counters 508. Some of the circuits (e.g., addressing logic circuit 904, pulse control circuit 902, pulse generator 932, controller 930, multiplexer (MUX) 940 and ripple counter 934) may be shared across all n analog counters 508. Other circuits (e.g., AND gates 506 and 936, analog counter 508, and comparator 938) may be replicated n times for each of the n histogram bins. Other implementations are also possible. For example, in some embodiments, comparator 938 may be implemented outside ADC 910.

FIG. 9 may be understood in view of FIG. 8.

During the integration phase (604), controller 930 causes MUXes 924 and 926 to select input signal $In_{502}$ and output code $Out_{102}$, respectively. Thus, during the integration phase (604), analog counter 508 increments its count each time input $In_{508}\_i$ is activated.

In some embodiments, during the integration phase (604), ADC 910 ignores output $Out_{508}\_i$. For example, in some embodiments, the ripple counter 934 may be deactivated (e.g., in reset mode) or the output of ripple counter 934 may be ignored during the integration phase (604). Other implementations are also possible.

At the start of the signal conversion phase (606) controller 930 causes MUXes 924 and 926 to select the output of pulse generator 932 ($Out_{932}$) and output code $Out_{930}$, respectively. During the signal conversion phase (606), when the ith analog counter 508 is selected for signal conversion, controller 930 causes MUX 940 to couple output signal $Out_{936}\_i$ to the input ($In_{934}$) of ripple counter 934, causes decoder 928 to select activate output $Out_{504}\_i$, and resets (e.g., via reset signal $Rst_{934}$) ripple counter 934. After ripple counter 934 is reset, pulse generator 932 generates a plurality of pulses to cause a respective plurality of activations of input $In508\_i$ to cause voltage $V_{cap}$ to decrease until reaching voltage $V_{ref}$. As illustrated by AND gate 936, ripple counter 934 increases its count $Cnt_{934}$ each time output $out_{932}$ pulses. Once output $Out_{508}\_i$ becomes lower than voltage $V_{ref}$, AND gate 936 outputs low, thus freezing the state of ripple counter 934, which has a count $Cnt_{934}$ equal to $Cnt_{remain}$. The count $Cnt_{934}$ (which at this point is equal to count $Cnt_{remain}$ for the ith analog counter 508) is transmitted to controller 930 for further processing.

During the full-scale conversion phase (706), when the ith analog counter 508 is selected for full-scale conversion, controller 930 causes MUX 940 to couple output signal $Out_{936}\_i$ to the input ($In_{934}$) of ripple counter 934, causes decoder 928 to select (activate) output $Out_{504}\_i$, resets (e.g., via reset signal $Rst_{934}$) ripple counter 934, and resets the ith analog counter 508. After ripple counter 934 is reset, pulse generator 932 generates a plurality of pulses to cause a respective plurality of activations of input $In_{508}\_i$ to cause voltage $V_{cap}$ to decrease until reaching voltage $V_{ref}$. As illustrated by AND gate 936, ripple counter 934 increases its count $Cnt_{934}$ each time output $out_{932}$ pulses. Once output $Out_{508\_i}$ becomes lower than voltage $V_{ref}$, AND gate 936 outputs low, thus freezing the state of ripple counter 934, which has a count $Cnt_{934}$ equal to $Cnt_{full\text{-}scale}$. The count $Cnt_{934}$ (which at this point is equal to $Cnt_{full\text{-}scale}$ for the ith analog counter 508) is transmitted to controller 930 for further processing.

In some embodiments, steps 606, 602, and 706 may be performed consecutively for each of the analog counters 508. For example, in some embodiments, for the ith analog counter, controller 930 causes MUX 940 to couple output signal $Out_{936\_i}$ to the input ($In_{934}$) of ripple counter 934 and causes decoder 928 to select activate output $Out_{504\_i}$, and the signal conversion (606), reset (602), and full-scale conversion (706) are performed before updating the state of MUX 940 and decoder 928 to select the next analog counter 508.

In some embodiments, the signal conversion phase 606 is performed for all n analog counters 508 before performing full scale conversion phase 706 for all n analog counters 508.

MUX 924 is configured to select between $In_{502}$ and $Out_{932}$ based on a selection input (e.g., 1 bit) from controller 930. MUX 926 is configured to select between $Out_{102}$ (e.g., $\log_2 n$ bits) and $Out_{930}$ (e.g., $\log_2 n$ bits) based on a selection input (e.g., 1 bit) from controller 930. MUX 940 is configured to select $Out_{936\_i}$ from n possible $Out_{936}$ based on a selection input (e.g., $\log_2 n$ bits). MUXes 924, 926, and 940 may be implemented in any way known in the art.

Ripple counter 934 is configured to increment an internal counter ($Cnt_{934}$) each time input $In_{934}$ is activated (e.g., pulsed). The count of the internal counter ($Cnt_{934}$) is provided to controller 930 for further processing (e.g., for performing Equation 1). The count of the internal counter ($Cnt_{934}$) is reset (e.g., to 0) when reset signal $Rst_{934}$ is activated. Ripple counter 934 may be implemented in any way known in the art (e.g., such as using flip-flops).

Decoder 928 may be implemented as a 1-of-n decoder in any way known in the art.

Pulse control logic 922 is configured to activate output $Out_{922}$ in synchronization with decoder 928 based on its input. For example, in some embodiments, pulse control logic 922 may include a delay circuit that activates output $Out_{902}$ a delay time after its input is activated such that output $Out_{902}$ is activated simultaneously or shortly after decoder 928 activates the output $Out_{504\_i}$.

Controller 930 is configured to control MUXes 924, 926, and 940, pulse generator 932 and ripple counter 934. Controller 930 is also configured to process the output of ripple counter 934, e.g., to perform Equation 1. In some embodiments, controller 930 may be implemented as a general purpose or custom controller or processor that includes, for example, combinatorial circuits. For example, in some embodiments, controller 930 includes a finite state machine (FSM). In some embodiments, controller 930 also includes a memory and is configured to execute instructions stored in the memory. Other implementations are also possible.

Pulse generator 932 is configured to generate pulses (e.g., of the same width). In some embodiments, pulse generator 932 generates a sequence of pulses (e.g., a clock signal) when activated (e.g., based on input $In_{932}$) and stops generating the sequence of pulses when deactivated (e.g., based on input $In_{932}$). In some embodiments, pulse generator 932 generates a pulse at output $Out_{932}$ each time input $In_{932}$ is activated (e.g., as a monostable circuit). Other implementations are also possible. For example, in some embodiments, controller 930 may implemented pulse generator 932.

Figure 10:
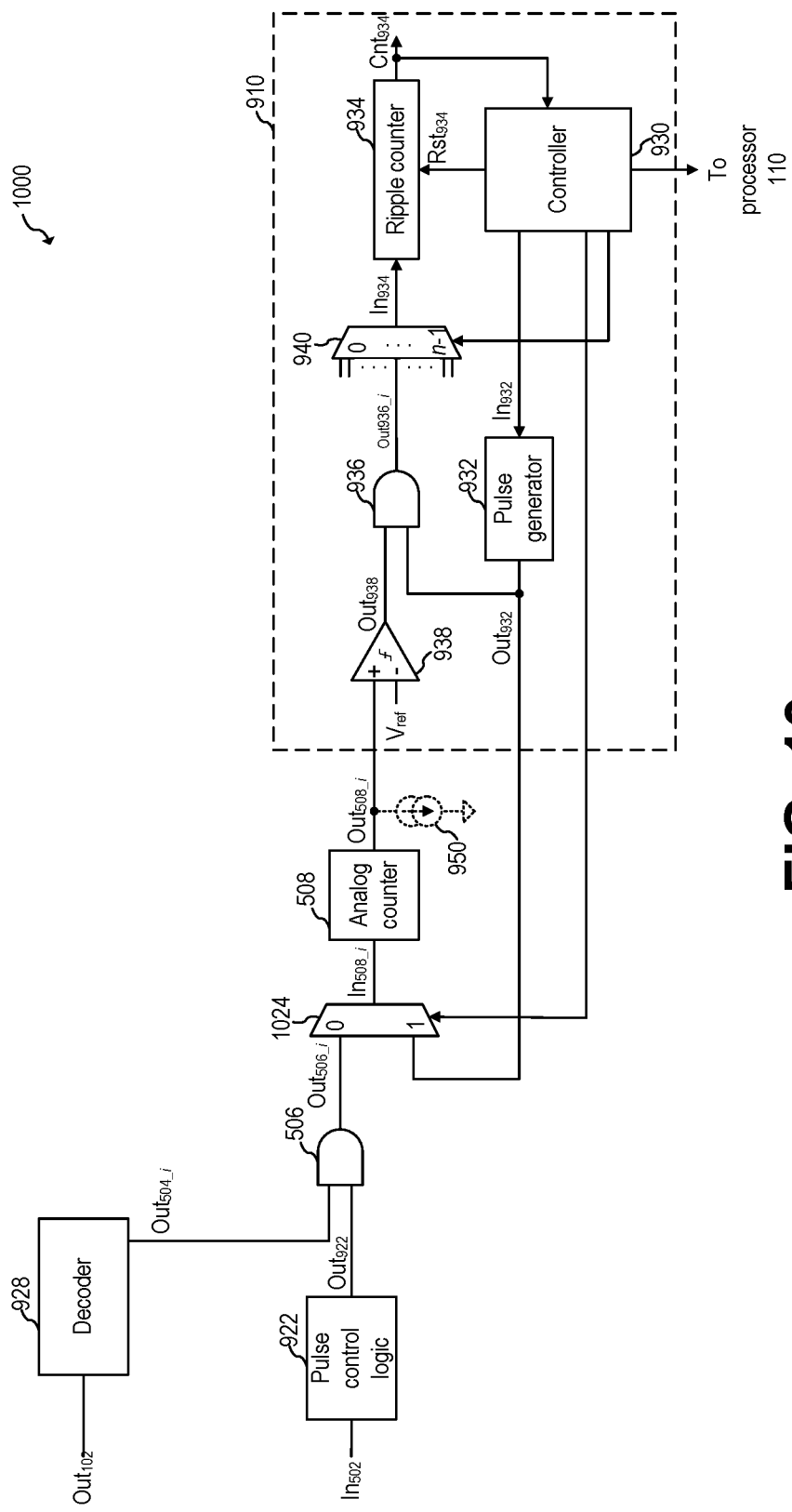

In some embodiments, ADC 510 causes a particular input signal $In_{508}$ of a particular analog counter 508 to activate multiple times during the signal conversion phase (606) by directly controlling the particular input signal $In_{508}$ of the particular analog counter 508. For example, FIG. 10 shows a schematic diagram of a portion of ToF system 1000 illustrating ADC 910, according to an embodiment of the present invention. ToF system 500 may be implemented as ToF system 1000. Addressing logic circuit 504 may be implemented as decoder 928. Pulse control circuit 502 may be implemented as pulse control circuit 922.

FIG. 10 illustrates the circuits associated with a single analog counter 508 (e.g., counter 508_i) of the n analog counters 508, where the ith analog counter 508 may be any of the n analog counters 508. Some of the circuits (e.g., decoder 928, pulse control logic 922, pulse generator 932, controller 930, MUX 940, and ripple counter 934) may be shared across all n analog counters 508. Other circuits (e.g., MUX 1024, AND gates 506 and 936, analog counter 508, and comparator 938) may be replicated n times for each of the n histogram bins. Other implementations are also possible.

ToF system 1000 operates in a similar manner as ToF system 900. ToF system 1000, however, includes MUX 1024 for propagating the output $Out_{932}$ from pulse generator 932 to the ith analog counter 508.

Figure 11:
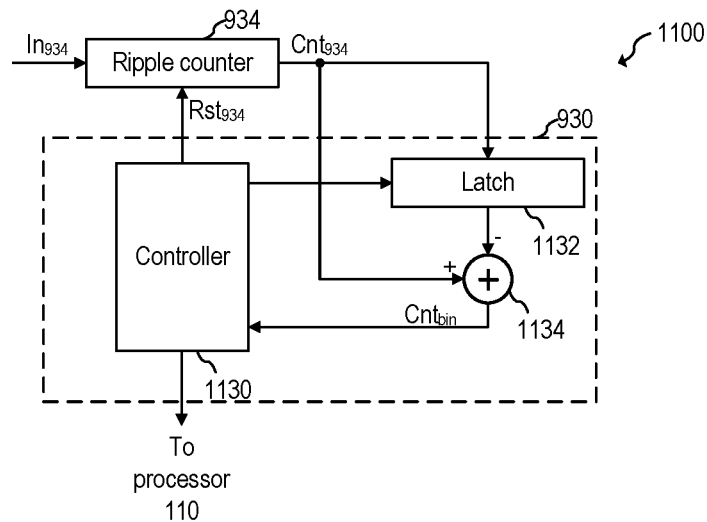
FIG. 11 shows a schematic diagram of a portion of the ADC of FIG. 9, according to an embodiment of the present invention.

FIG. 11 shows a schematic diagram of a portion of ADC 1100, according to an embodiment of the present invention. ADC 910 may be implemented as ADC 1100.

As shown in FIG. 11, controller 930 may implement Equation 1 with latch 1132 and adder 1134. For example, after the signal conversion step 606 for the ith analog counter 508 finishes, the count $Cnt_{934}$ (which at this point corresponds to $Cnt_{remain}$) is stored in latch 1132. After the full-scale conversion step 706 for the ith analog counter 508, adder 1134 subtracts the content of latch 1132 from the content of count $Cnt_{934}$ (which at this point corresponds to $Cnt_{full\text{-}scale}$). The resulting bin count $Cnt_{bin}$ is transmitted to controller 1130.

In some embodiments, latch 1132 may be implemented, e.g., as a register, such as an m-bit register. Other implementations are also possible. In some embodiments, m is 8-bits or higher, such as 10-bits, 12, bits or higher. In some embodiments, may be lower than 8-bits, such as 7-bits or lower.

Adder 1134 may be implemented in any way known in the art.

In some embodiments, controller 1130 may be implemented as a general purpose or custom controller or processor that includes, for example, combinatorial circuits. For example, in some embodiments, controller 1130 includes a finite state machine (FSM). In some embodiments, controller 1130 also includes a memory and is configured to execute instructions stored in the memory. Other implementations are also possible.

Figure 12:
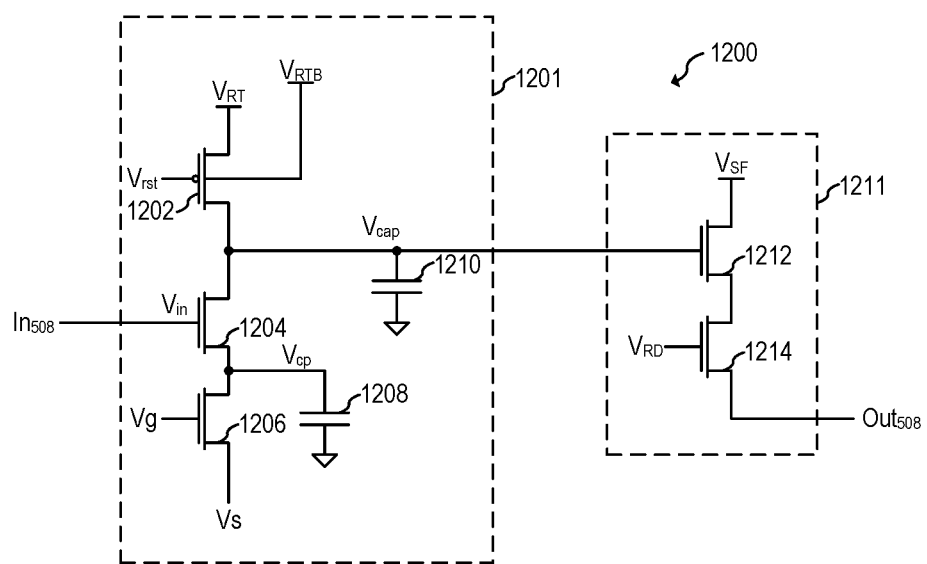
FIG. 12 shows a schematic diagram of the analog counter of FIG. 5, according to an embodiment of the present invention.

FIG. 12 shows a schematic diagram of analog counter 1200, according to an embodiment of the present invention. Analog counter 508 may be implemented as analog counter 1200. Analog counter 1200 includes charge transfer amplifier 1201 and readout circuit 1211.

As illustrated, e.g., by FIGS. 9, 10, and 12, some embodiments may avoid using a sample and hold circuit coupled between the output of the analog counter 508 (e.g., the source of transistor 1214) and comparator 938, which may advantageously result in a smaller, lower power implementation, and may advantageously avoid kTC sampling noise associated with sample and hold circuits. A current source (e.g., 950) may be coupled to output Out$_{508}$, e.g., to provide a bias current for source follower transistor 1212.

In some embodiments, storage capacitor 1210 may be implemented, e.g., as a metal-oxide-semiconductor (MOS) capacitor, as a metal-oxide-metal (MOM) capacitor, or a combination of MOM and MOS capacitors. Some embodiments may implement storage capacitor 1210 with a reverse biased diode. Other implementations are also possible.

Figure 13:
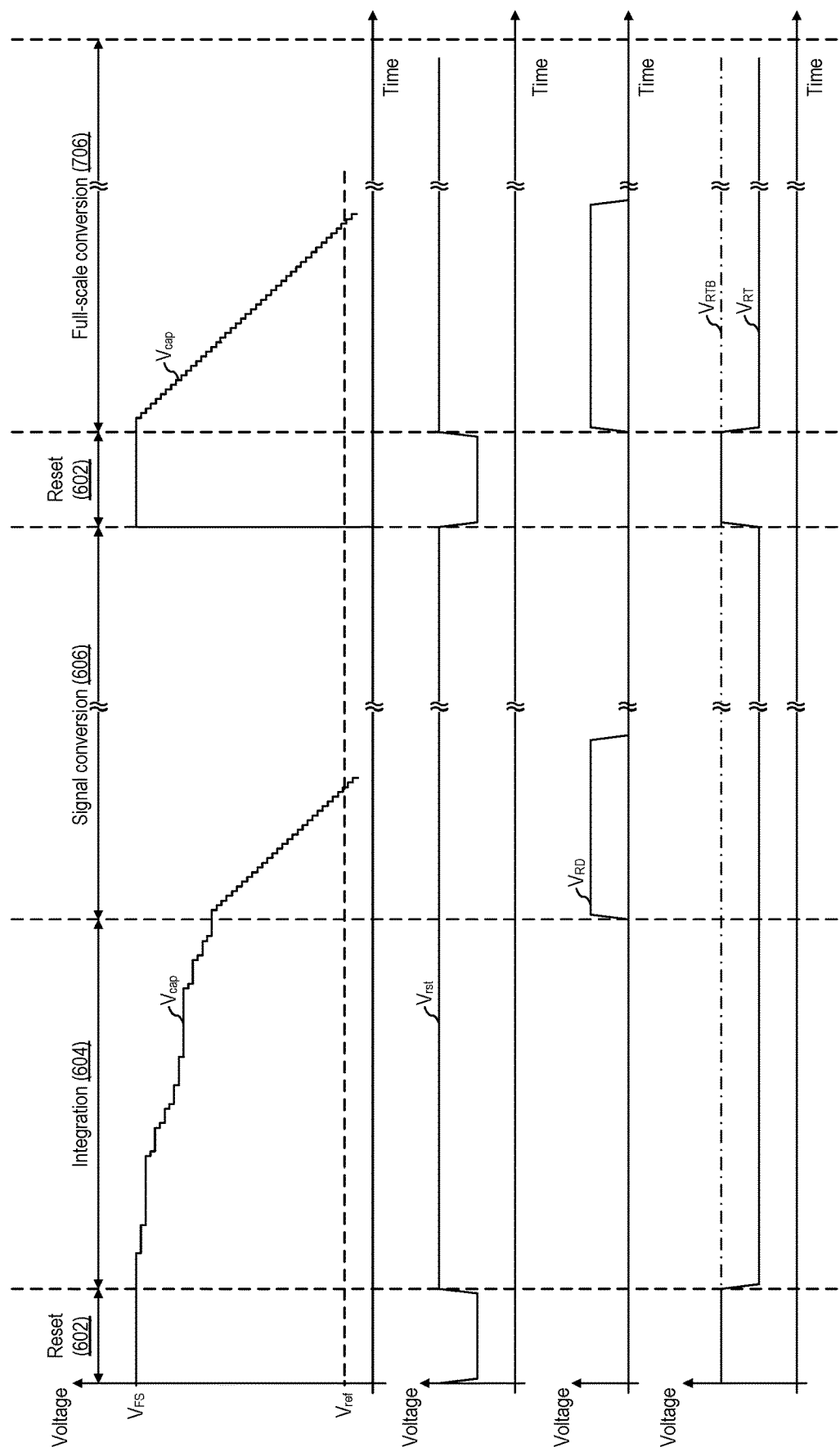
FIG. 13 shows a timing diagram of waveforms associated with the analog counter of FIG. 12 during performance of the method of FIG. 7, according to an embodiment of the present invention.

FIG. 13 shows a timing diagram of waveforms associated with analog counter 1200 during performance of method 700, according to an embodiment of the present invention. FIGS. 12 and 13 may be understood together.

During the reset phase (602), reset transistor 1202 is turned on by lowering voltage V$_{rst}$ while transistors 1204 is off, thus allowing storage capacitor 1210 to charge to full-scale voltage V$_{FS}$, as shown in FIG. 13. During the reset phase (602), voltage V$_{cp}$ also gets reset to voltage Vs by turning on transistor 1206.

During the integration phase (604), each time input In$_{508}$ is activated (e.g., pulsed), charge flows from capacitor 1210 to capacitor 1208. While input In$_{508}$ is high, capacitor 1208 charges until transistor 1204 is in cutoff from voltage Vs to voltage V$_{in}$-V$_{th}$, where V$_{th}$ is the threshold voltage of transistor 1204. Thus, a quantized amount of charge is transferred out of capacitor 1210 each time input In$_{508}$ is activated. Once transistor 1204 is off (when input In508 is deactivated), transistor 1206 is turned on (e.g., pulsed) to reset the voltage V$_{cp}$ to Vs, thus allowing for the next charge transfer upon activation of input In$_{508}$.

In some embodiments, the voltage step size ΔV that voltage V$_{cap}$ exhibits each time input In$_{508}$ is activated may be given by $$\Delta V = (\Delta V_{in} - Vs - V_{th}) \cdot \frac{C_{1208}}{C_{1210}} \quad (2)$$

where ΔV$_n$ is the different between the voltage Vin when input In508 is activated and the voltage Vin when input In508 is deactivated, C$_{1208}$ is the capacitance of capacitor 1208 and C$_{1210}$ is the capacitance of capacitor 1210. As can be seen from Equation 2, voltage V$_{cap}$ may not affect the magnitude of the voltage step size ΔV. In some embodiments, the voltage step size ΔV may be kept constant by keeping constant voltage Vs. In some embodiments, voltage Vs may be adjusted to change the voltage step size ΔV and thus change the dynamic range (the maximum number of activations of input In$_{508}$ to reach voltage V$_{ref}$) of analog counter 1200.

During the conversion phases (606 and 706), transistor 1214 is turned on so that voltage V$_{cap}$ is visible to, e.g., comparator 938, via transistor 1212, which is in source-follower configuration.

As shown in FIG. 13, during the integration phase (604), and during the conversion phases (606 and 706), reset transistor 1202 is in cutoff by keeping the source voltage V$_{RT}$ at the source terminal of reset transistor 1202 below the gate voltage V$_{rst}$ of reset transistor 1202 and below the bulk voltage V$_{RTB}$ of the bulk terminal of reset transistor 1202. For example, in some embodiments, during the integration phase (604), and during the conversion phases (606 and 706), Voltage V$_{RT}$ is 3 V and voltages V$_{rst}$ and V$_{RTB}$ may be equal to 3.3 V. In cutoff, reset transistor 1202 may advantageously reduce the leakage flowing from supply voltage V$_{RT}$ into storage capacitor 1210, which may advantageously improve accuracy of the analog counter.

In some embodiments, voltage V$_{RTB}$ may be kept at 4 V and voltage V$_{RT}$ may transition between, e.g., 3.3 V and 4 V, as shown in FIG. 13. In some embodiments, voltage V$_{RT}$ may be kept at 3.3 V, and voltage V$_{RTB}$ may transition between 3.3 V and 4 V to achieve the same voltage differences shown in FIG. 13. Different voltages, such as higher than 3.3 V (e.g., 5 V or higher), or lower than 3.3 V (e.g., 3 V, or lower), may also be used.

In some embodiments, voltage V$_{in}$ when input In$_{508}$ is activated is 1.1 V and voltage V$_{in}$ when input In$_{508}$ is deactivated is 0 V. Other voltages may also be used.

In some embodiments, voltage V$_{SF}$ may be, e.g., 3.3 V. Other voltages may also be used.

In some embodiments, voltage Vs may be, e.g., 300 mV. Other voltages may also be used.

In some embodiments, voltage Vg is used to compensate for the body effect on the threshold voltage of transistor 1206 when transistor 1206 is activated. In some embodiments, voltage Vg is kept below the threshold so that transistor 1206 acts as a resistor to discharge capacitor 1208.

In some embodiments, capacitor 1210 may have 100 times higher capacitance than capacitor 1208. Other rations such as 90, 50, or lower, or higher, such as 150, 200, or higher, may also be used. For example, in some embodiments, capacitor 1210 may have a capacitance of 100 fF and capacitor 1208 may have a capacitance of 1 fF. Other capacitances may also be used.

Figure 14:
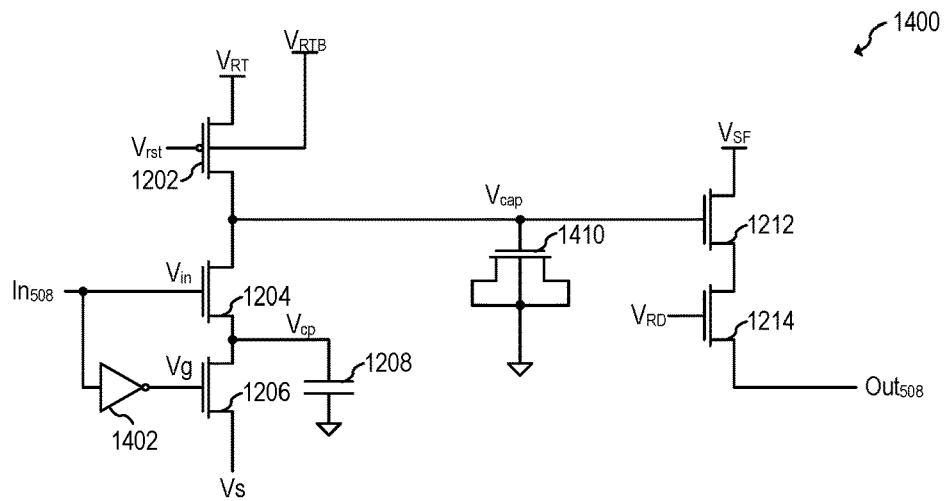
FIG. 14 shows a schematic diagram of the analog counter of FIG. 5, according to an embodiment of the present invention.

FIG. 14 shows a schematic diagram of analog counter 1400, according to an embodiment of the present invention. Analog counter 508 may be implemented as analog counter 1400. Analog counter 1400 operates in a similar manner as analog counter 1200. Analog counter 1400, however, includes inverter 1402 for controlling voltage Vg based on input In$_{508}$. Analog counter also implements capacitor 1210 as MOS capacitor 1410.

Figure 15:
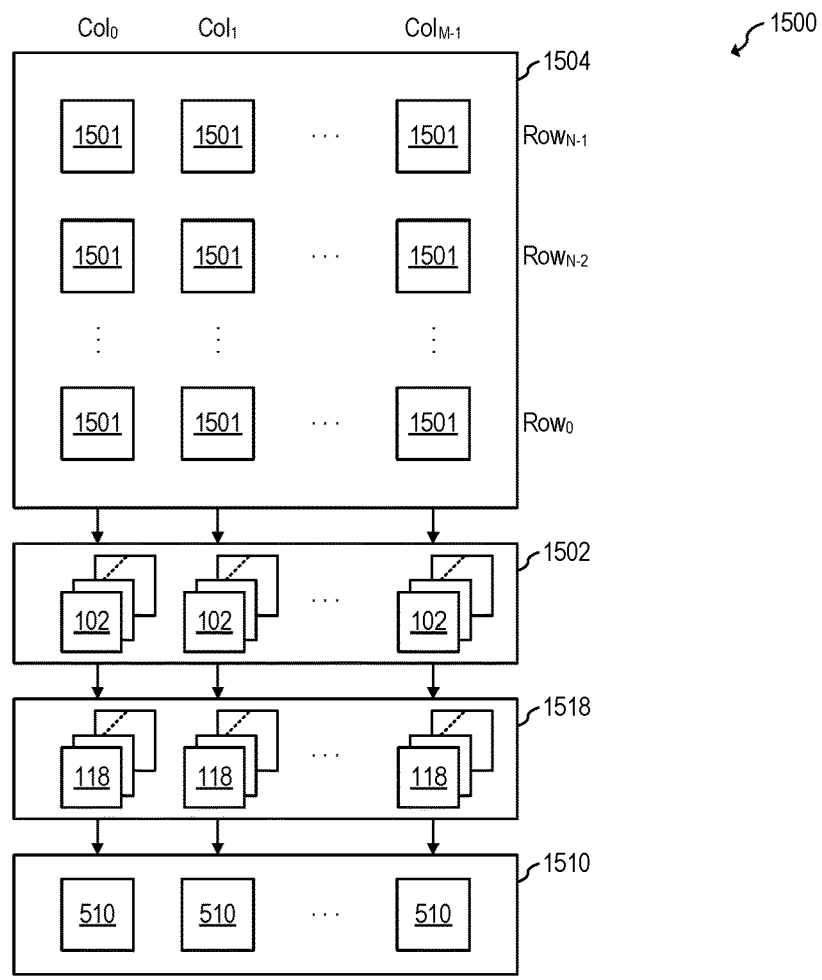
FIGS. 15 and 16 show diagrams illustrating a portion of ToF systems, according to embodiments of the present invention.
Figure 20A:
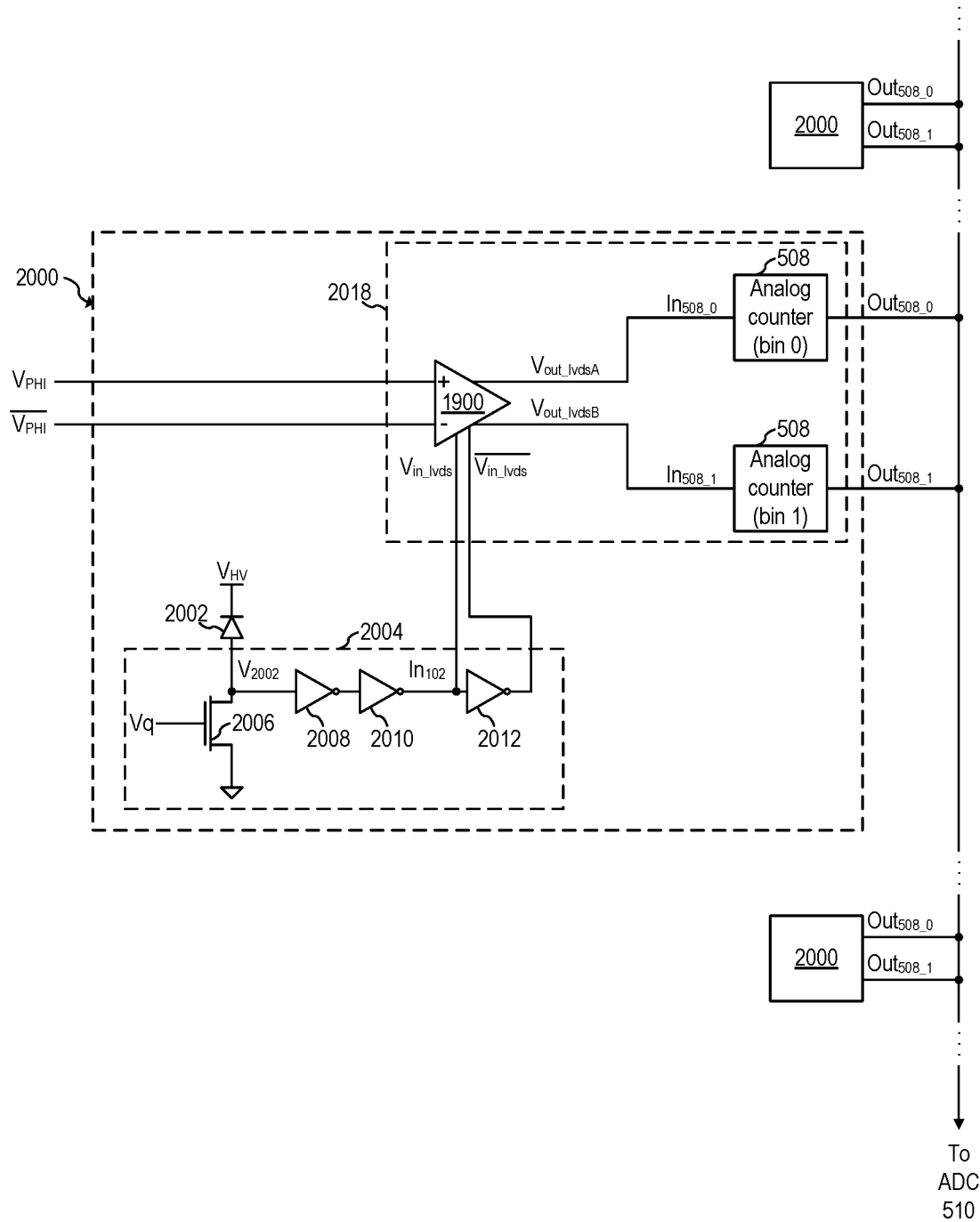
FIGS. 20A and 20B show a pixel as part of a SPAD array, and a corresponding timing diagram, respectively, according to an embodiment of the present invention.

FIG. 15 shows a diagram illustrating a portion of ToF system 1500, according to an embodiment of the present invention. ToF system 1500 includes SPAD array 1504, TDC set 1502, histogram generation circuit set 1518, and ADC set 1510. SPAD array 1504 includes a plurality of pixels 1501. Pixel 1501 includes a SPAD (e.g., 202) or SPADs (e.g., 302), and a SPAD front-end circuit (e.g., a quench transistor and one or more additional transistors, such as SPAD front-end circuit 2004, e.g., as illustrated in FIG. 20A).

ToF systems 100, 500, 900, and 1000 may be implemented as ToF system 1500. SPAD array 104 may be implemented as SPAD array 1504.

As shown in FIG. 15, SPAD array 1504 may include a plurality of SPAD pixels 1501 arranged in M columns and N rows. In some embodiments, M may be 96 and N may be 64. In some embodiments, M may be higher than 96, such as 128, 256, or higher, or lower than 96, such as 64, 48, 36, or lower. In some embodiments, N may be higher than 64, such as 96, 128, 256, or higher, or lower than 64, such as 48, 36, or lower. In some embodiments, M may be equal to N. In some embodiments, SPAD array may include thousands or millions of pixels. For example, in some embodiments, 1 MP array may be achieved by using M equal to N equal to 1000. In some embodiments, each pixel may include, e.g., a micropixel of 4×4 SPADs going through an OR tree (e.g., 304). Other implementations are also possible.

As shown in FIG. 15, in some embodiments, TDC set 1502 may include a plurality of TDCs 102 arranged in M columns of N TDCs 102, where each TDC 102 is coupled to a respective SPAD pixel 1501.

As shown in FIG. 15, in some embodiments, a histogram generation circuit set 1518 may include a plurality of histogram generation circuits 118 arranged in M columns of N histogram generation circuits 118, where each histogram generation circuits 118 is coupled to a respective TDC 102.

As shown in FIG. 15, in some embodiments, ADC set 1510 may include M ADCs 510, where each ADC 510 is coupled to the N histogram generation circuits 118 of the same column (e.g., one ADC 510 per column of SPAD array 1504). For example, in some embodiments, the same ADC 510 may be used to sequentially read histogram bin counts from each of the M histogram generation circuits 118 of the same column. In some embodiments, the ADC set 1510 may include more than one ADC 510 per column, such as 2 ADCs per column, or more, such as N ADC 510 per column. In some embodiments using N ADCs 510 per column, each ADC 510 is coupled to a respective histogram generation circuit 118.

In some embodiments, ToF system 1500 may advantageously be used in global shutter mode, in which all pixels (e.g., 1501) of an image sensor (e.g., SPAD array 1504) are integrated (e.g., step 604) simultaneously, thereby advantageously capturing the entire ToF image at the same instant. In some embodiments, ToF system 1500 may also advantageously be used in rolling shutter mode, in which a ToF image is captured by scanning the scene row by row or column by column.

ToF system 1500 may be implemented with a different number of TDCs 102, histogram generation circuits 118 and/or ADCs 510. For example, in some embodiments, M×N ADCs 510 may be used to allow, which may advantageously allow for simultaneous readout of all ToF histograms associated with M×N histogram generation circuits 118 of the histogram generation circuits set 1518.

Figure 16:
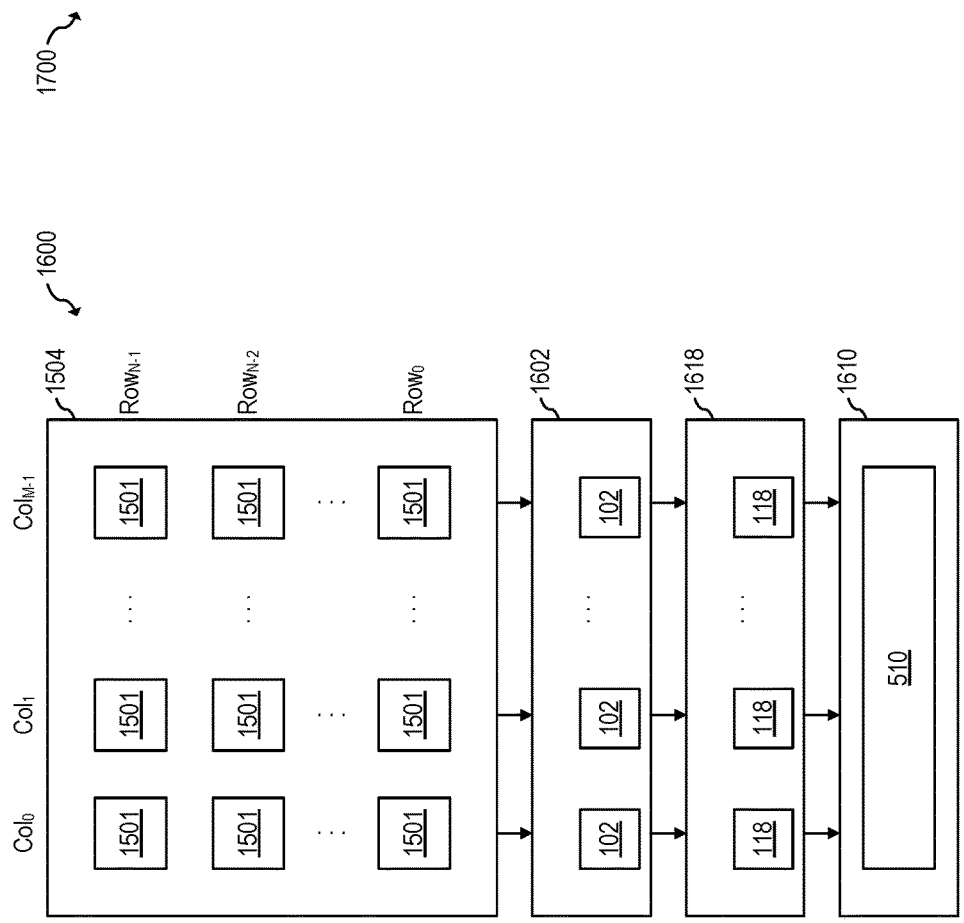

FIG. 16 shows a diagram illustrating a portion of ToF system 1600, according to an embodiment of the present invention. ToF systems 100, 500, 900, and 1000 may be implemented as ToF system 1600.

ToF system 1600 operates in a similar manner as ToF system 1500. ToF system 1600, however, includes TDC set 1602 including M TDCs 102 (e.g., where each TDC 102 is coupled to N SPAD pixels 1501 (e.g., one TDC 102 per column of SPAD array 1504). ToF 1600 also includes histogram generation circuit set 1618 including M histogram generation circuits 118 (e.g., where each histogram generation circuits 118 is coupled to a respective TDC 102 (e.g., one TDC 102 per column of SPAD array 1504). ToF 1600 may also include a single ADC 510 shared across the plurality of histogram generation circuits 118 of the set of histogram generation circuits 1618 (e.g., a single shared ADC 510 for the SPAD array 1504).

In some embodiments, ToF system 1600 may advantageously be used in rolling shutter mode with, e.g., lower area footprint than, e.g., ToF system 1500.

Figure 17:
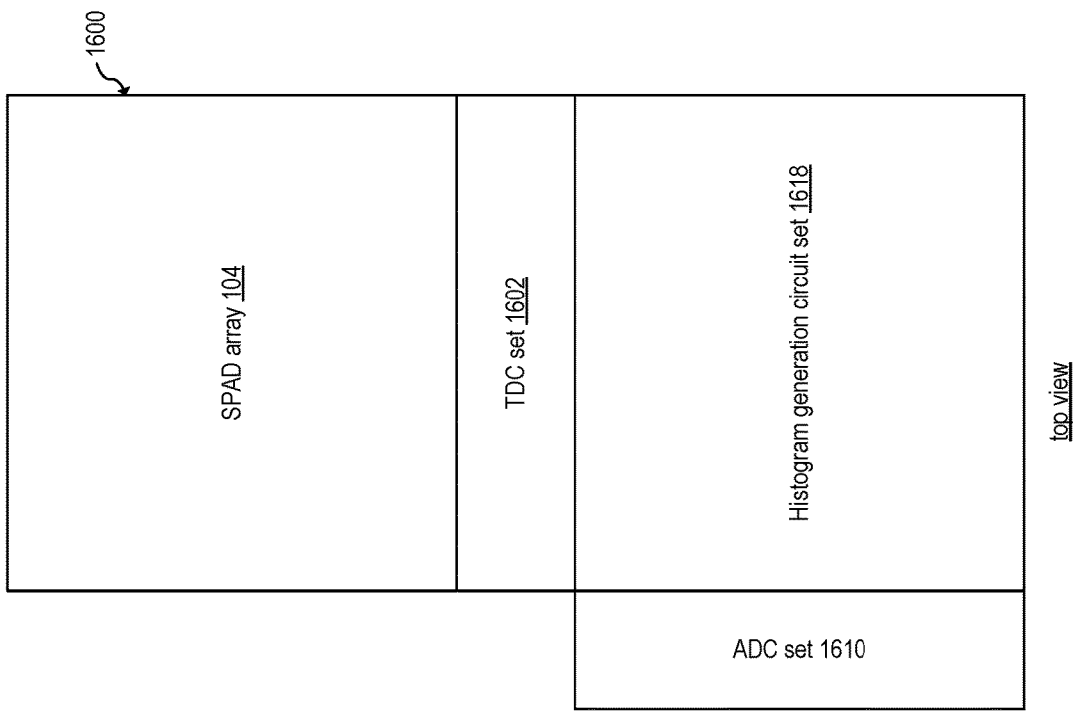
FIG. 17 shows a diagram illustrating a top view of a layout of a possible implementations of a portion of ToF system of FIG. 16 (not to scale), according to embodiments of the present invention.

FIG. 17 shows a diagram illustrating a top view of layout 1700 of a possible implementation of a portion of ToF system 1600 (not to scale), according to embodiments of the present invention. As shown in FIG. 17, TDCs 102 may be disposed between SPAD array 1504 and histogram generation circuits 1518, where all TDCs 102 are disposed together, all histogram generation circuits 118 are disposed together, and all ADCs 510 are disposed together. Other implementations are also possible. For example, in some embodiments, a ToF system (e.g., ToF systems 100, 500, 900, 1000, 1500, and/or 1600) may be implemented using a 3D stack, where the top die includes the SPAD (e.g., 202, 302) and the bottom die includes the TDCs 102, and the histogram generation circuits 118. In some embodiments, the top die may also include at least a portion of the front-end circuit of the SPAD.

In an embodiment of the present invention, low power clocking is advantageously achieved by using an LVDS latch as part of the front-end of the timing circuit (e.g., TDC 102). By using LVDS latches for routing clock signals, some embodiments advantageously reduce power consumption of a ToF system (e.g., 100, 500, 900, 1000, 1500, and/or 1600) without sacrificing performance.

Figure 18:
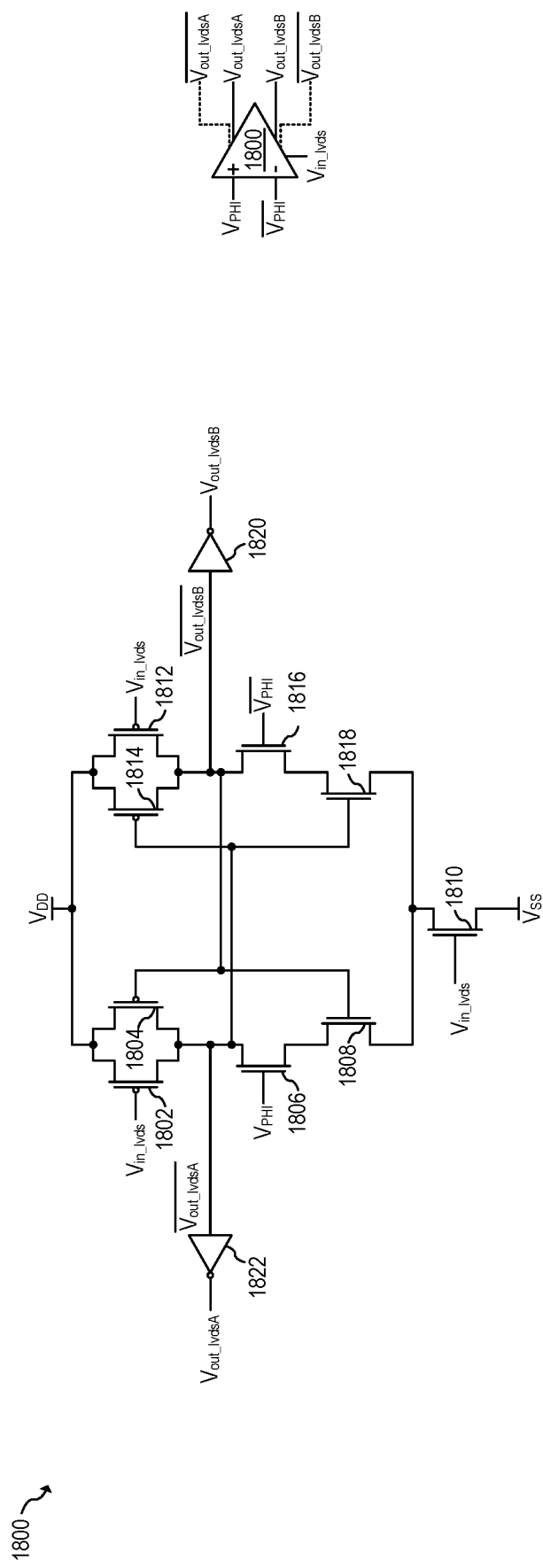
FIGS. 18 and 19 show low-voltage digital signaling (LVDS) latches, according to embodiments of the present invention.

FIG. 18 shows LVDS latch 1800, according to an embodiment of the present invention. The left portion of FIG. 18 shows a schematic diagram of LVDS latch 1800. The right portion of FIG. 18 shows a schematic symbol of LVDS latch 1800. As shown in FIG. 18, signals $V_{in\_lvds}$, and $V_{PHI}$ and $\overline{V_{PHI}}$ are input signals of LVDS latch 1800, and signals $V_{out\_lvdsA}$ and $V_{out\_lvdsB}$ are output signals of LVDS latch 1800. As illustrated in the right portion of FIG. 18, some embodiments may optionally output signals $\overline{V_{out\_lvdsA}}$ and $\overline{V_{out\_lvdsB}}$.

In some embodiments, signals $V_{PHI}$ and $\overline{V_{PHI}}$ are differential signals with a relatively low average voltage (e.g., 500 mV to 600 mV), and a relatively low peak-to-peak voltage (e.g., 100 mV to 200 mV). Other values may also be used.

During normal operation, when input signal $V_{in\_lvds}$ is low (deasserted), the latch formed by transistors 1804, 1808, 1814, and 1818 is deactivated (since transistor 1810 is off). Thus, little or no current is consumed by LVDS latch 1800 when $V_{in\_lvds}$ is low. As also shown in FIG. 18, when input signal $V_{in\_lvds}$ is low, transistors 1802 and 1812 pull up signals $\overline{V_{out\_lvdsA}}$ and $\overline{V_{out\_lvdsB}}$, respectively, which causes output signals $V_{out\_lvdsA}$ and $V_{out\_lvdsB}$ to be low.

When $V_{in\_lvds}$ transitions from a low state to a high state, the state of output signals $V_{out\_lvdsA}$ and $V_{out\_lvdsB}$ depend on the state of input signals $V_{PHI}$ and $\overline{V_{PHI}}$ at the time $V_{in\_lvds}$ transitions from a low state to a high state. For example, if signals $V_{PHI}$ and $\overline{V_{PHI}}$ are high and low, respectively, at the time $V_{in\_lvds}$ transitions from a low state to a high state, then, output signal $V_{out\_lvdsA}$ latches to a high state and output signal $V_{out\_lvdsB}$ latches to a low state. If signals $V_{PHI}$ and $\overline{V_{PHI}}$ are low and high, respectively, at the time $V_{in\_lvds}$ transitions from a low state to a high state, then, output signal $V_{out\_lvdsA}$ latches to a low state and output signal $V_{out\_lvdsB}$ latches to a high state.

As can be seen from FIG. 18, LVDS latch 1800 signals $V_{PHI}$ and $\overline{V_{PHI}}$ drive high impedance input gates, is triggered by input signal $V_{in\_lvds}$ and LVDS latch 1800 is turned off by tail transistor 1810 when input signal $V_{in\_lvds}$ is low. Thus, in some embodiments, LVDS latch 1800 may advantageously consume little or no power, except during a state transition (e.g., during the rise time or fall time of signal $V_{in\_lvds}$).

In some embodiments, signals $V_{PHI}$ and $\overline{V_{PHI}}$ may be clock signals, such as from $CLK_{sample}$. For example, in some embodiments, low power differential signals (e.g., 200 mV peak-to-peak signal with average voltage of 600 mV) may be used to propagate a plurality of out-of-phase clock signals $CLK_{sample}$ to TDC 102. For example, in embodiments in which digital code $Out_{102}$ is a 7-bit word, 7 out-of-phase clock signals may be propagated with 7 low power differential signals from timing generation circuit 108 to a TDC 102. TDC 102 may then generate the 7-bit digital code $Out_{102}$ based on the 7 out-of-phase clock signals and the output of the SPAD (e.g., signal $In_{102}$). By propagating the clock signal(s) of a ToF system using one or more LVDS latches, some embodiments may advantageously achieve power savings associated with not propagating the clock signal at full swing from the source (e.g., timing generation circuit 108) to the TDCs 102.

Figure 19:
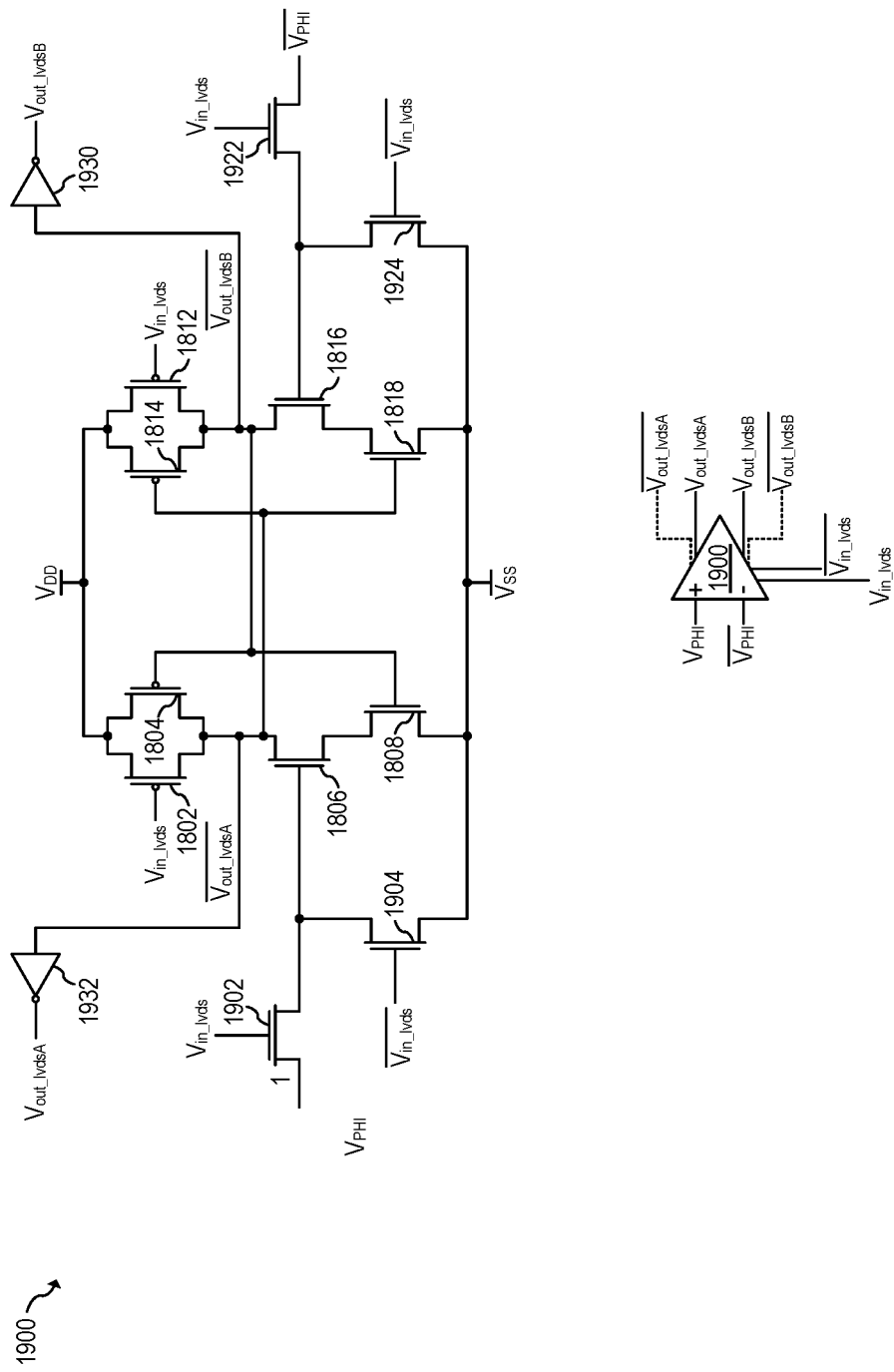

FIG. 19 shows LVDS latch 1900, according to an embodiment of the present invention. The top portion of FIG. 19 shows a schematic diagram of LVDS latch 1900. The bottom portion of FIG. 19 shows a schematic symbol of LVDS latch 1900. As shown in FIG. 19, signals $V_{in\_lvds}$ and $\overline{V_{in\_lvds}}$, and $V_{PHI}$ and $\overline{V_{PHI}}$ are input signals of LVDS latch 1900, and signals $V_{out\_lvdsA}$ and $V_{out\_lvdsB}$ are output signals of LVDS latch 1900. As illustrated in the bottom portion of FIG. 19, some embodiments may optionally output signals $\overline{V_{out\_lvdsA}}$ and $\overline{V_{out\_lvdsB}}$. In some embodiments, signal $\overline{V_{in\_lvds}}$ may be generated for LVDS latch 1900 by a circuit external to LVDS latch 1900. In some embodiments, signal $\overline{V_{in\_lvds}}$ may be generated by LVDS latch 1900, e.g., using an inverter of LVDS latch 1900 (not shown), instead of receiving signal $\overline{V_{in\_lvds}}$ as an input of LVDS latch 1900.

LVDS latch 1900 operates in a similar manner as LVDS latch 1800. LVDS latch 1900, however, replaces transistor 1810 with transistors 1902, 1904, 1922, and 1924, to achieve a 3-transistor stacked implementation (compared to a 4-transistor stacked implementation of LVDS latch 1800). In some embodiments, implementing the LVDS latch with a 3-transistor stack implementation advantageously allows for the use of lower supply voltage ($V_{DD}$) when compared with a 4-trasnistor stacked implementation.

In some embodiments, ToF systems 100, 500, 900, 1000, 1500, and/or 1600, may implement LVDS latches (e.g., 1800 and/or 1900) as part of the front-end of TDC 102.

Figure 20B:
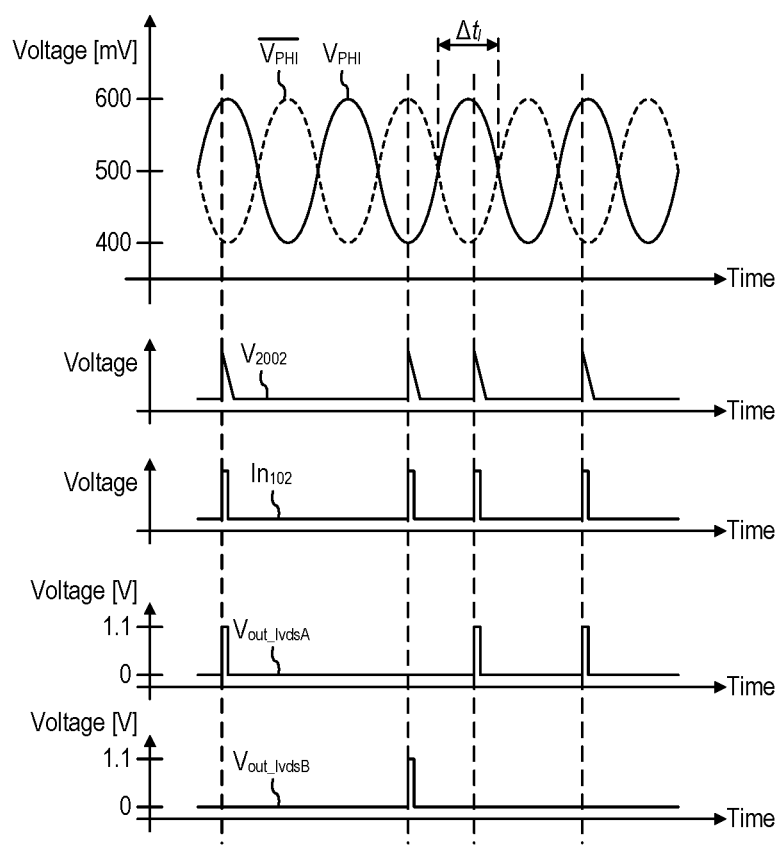

In some embodiments, using ToF histograms with a small number of bins may advantageously allow for a small implementation, and may advantageously allow for incorporating the histogram generation circuit (e.g., 118) inside the pixel. For example, FIG. 20A shows pixel 2000 as part of SPAD array 2003, according to an embodiment of the present invention. Pixel 2000 includes SPAD 2002, SPAD front-end circuit 2004, and TDC and histogram generation circuit 2018. FIG. 20B shows a timing diagram of pixel 2000, according to an embodiment of the present invention. FIGS. 20A and 20B may be understood together.

As can be seen in FIGS. 20A and 20B, pixel 2000 is capable of generating a 2-bin ToF histogram. For example, when SPAD 2002 generates a SPAD event (e.g., when a photon is received by SPAD 2002), voltage $V_{2002}$ rises, causing a pulse in signal $In_{102}$. LVDS latch 1900 then asserts either output signal $V_{out\_lvdsA}$ or output signal $V_{out\_lvdsB}$ depending on the state of input signals $V_{PHI}$ and $\overline{V_{PHI}}$ at the time of the pulse of signal $In_{102}$. For example, when signal $V_{PHI}$ is higher than signal $\overline{V_{PHI}}$ when signal $In_{102}$ is pulsed, then bin 0 is incremented. When signal $V_{PHI}$ is lower than signal $\overline{V_{PHI}}$ when signal $In_{102}$ is pulsed, then bin 1 is incremented.

In some embodiments, signal $CLK_{sample}$ may be transmitted from timing generation circuit 108 to LVDS latch 1900 of pixel 2000 as low-voltage differential signals $V_{PHI}$ and $\overline{V_{PHI}}$. As shown in FIG. 20B, signals $V_{PHI}$ and $\overline{V_{PHI}}$ may be implemented with a sinusoidal waveform. Other wave shapes, such as a square wave, may also be used.

As shown in FIG. 20A, SPAD front-end circuit 2004 may be implemented with quench transistor 2006, and a chain of inverters (e.g., 2008, 2010, and 2012). Inventers 2008, 2010, and 2012, may be understood to form a routing circuit 112 that couples the output of SPAD 2002 with the input of LVDS latch 1900.

As can be seen in FIGS. 20A and 20B, LVDS latch 1900 simultaneously operates as a TDC (e.g., 102) and as a decoder (e.g., 928), where LVDS latch 1900 causes either bin 0 or bin 1 to be incremented depending on the time of the SPAD event (e.g., when $In_{102}$ is asserted). In some embodiments, pixel 2000 may use other types of LVDS latches, such as LVDS latch 1800. In some embodiments, e.g., such as some embodiments in which LVDS latch does not use signal $\overline{V_{in\_lvds}}$ (e.g., such as LVDS latch 1800), inverter 2012 may be omitted (e.g., as illustrated by front-end circuit 2404 of FIG. 24).

In some embodiments, pixel 2000 operates as an indirect ToF (ITOF) sensor, where the light source (e.g., 106) operates as a continuous wave modulated light source (e.g., with 50% duty cycle), and where the distance to an object is calculated based on the phase of the returned light, e.g., as captured by bins 0 and 1 of pixel 2000. For example, in some embodiments, the distance $d_t$ to an object may be determined (e.g., based on pixel 2000) by $$d_t = \frac{1}{2} c \Delta t_l \left( \frac{Cnt_{bin1}}{Cnt_{bin0} + Cnt_{bin1}} \right) \qquad (3)$$

where c is the speed of light, $\Delta t_l$ is the period of time in which the light source (e.g., 106) is on, and $Cnt_{bin1}$ and $Cnt_{bin0}$ are the counts of bin 1 and bin 0, respectively.

Figure 21:
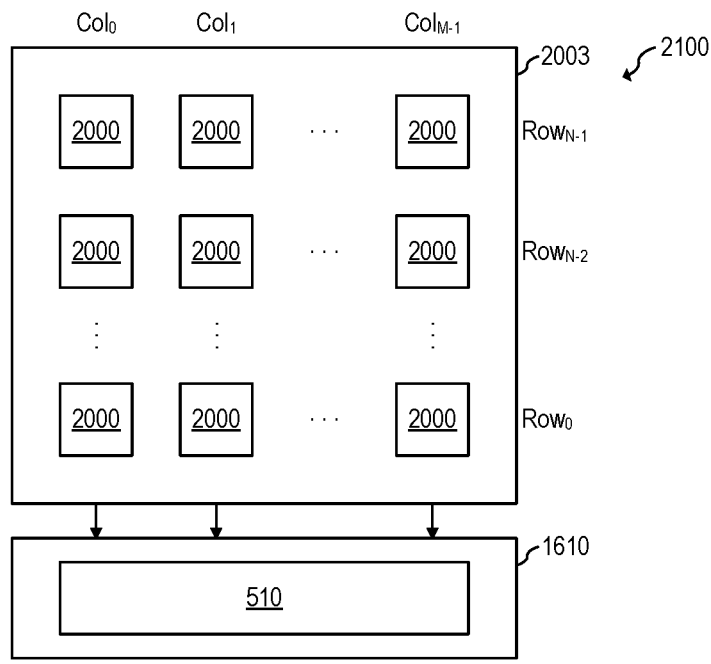
FIG. 21 shows a diagram illustrating a portion of a ToF system, according to an embodiment of the present invention.

FIG. 21 shows a diagram illustrating a portion of ToF system 2100, according to an embodiment of the present invention. ToF system 2100 includes SPAD array 2003, and ADC set 1610. SPAD array 2003 includes a plurality of pixels 2000.

As shown in FIG. 21, ToF system 2100 may operate in global shutter mode. A single ADC 510 may be used to sequentially readout ToF histograms from pixels 2000. In some embodiments more ADCs 510 may be used. For example, in some embodiments, ToF system 2100 may implement ADC set 1510 instead of ADC set 1610.

Figure 22:
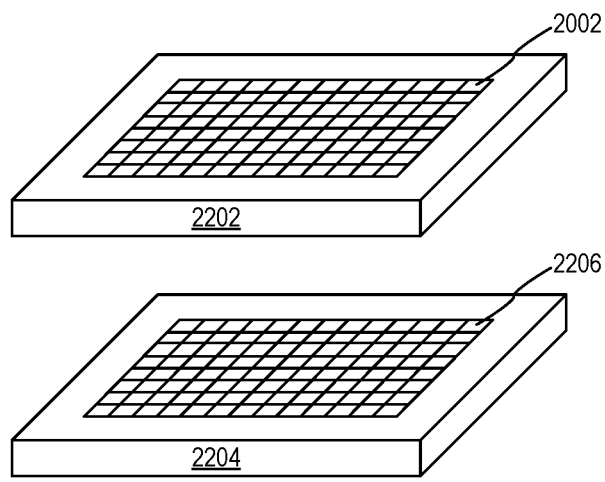
FIG. 22 shows a diagram illustrating a perspective view of a layout of a possible implementations of a portion of the ToF system of FIG. 21, according to embodiments of the present invention.

In some embodiments, ToF system 2100 may be implemented in a monolithic semiconductor substrate, e.g., in a similar manner as layout 1700. In some embodiments, ToF 2100 may be implemented using a 3D stack, where the top die includes the SPAD (e.g., 2002) and the bottom die includes SPAD front-end circuit 2004, and TDC and histogram generation circuit 2018. For example, FIG. 22 shows a diagram illustrating a perspective view of layout 2200 of a possible implementations of a portion of ToF system 2100 (not to scale), according to embodiments of the present invention. As shown in FIG. 22, top die 2202 includes an array of SPADs 2002; and bottom die 2204 includes a corresponding plurality of pixels 2206, where each pixel 2206 includes SPAD front-end circuit 2004, and TDC and histogram generation circuit 2018. Other implementations are also possible. For example in some embodiments, top die 2202 may include a portion of front-end circuit 2004, such as a quench element or front-end inverter (e.g., 2008, 2010), for example.

In some embodiments, top die 2202 and bottom die 2204 may be bonded using a hybrid bond. Other implementations are also possible.

As shown in FIG. 22, the array of pixels 2206 may be disposed directly beneath the array of SPADs 2002. In some embodiments, The ADC set (e.g., 1510, 1610) may be disposed adjacent to the array of pixels 2206 in the bottom die 2204.

Figure 23A:
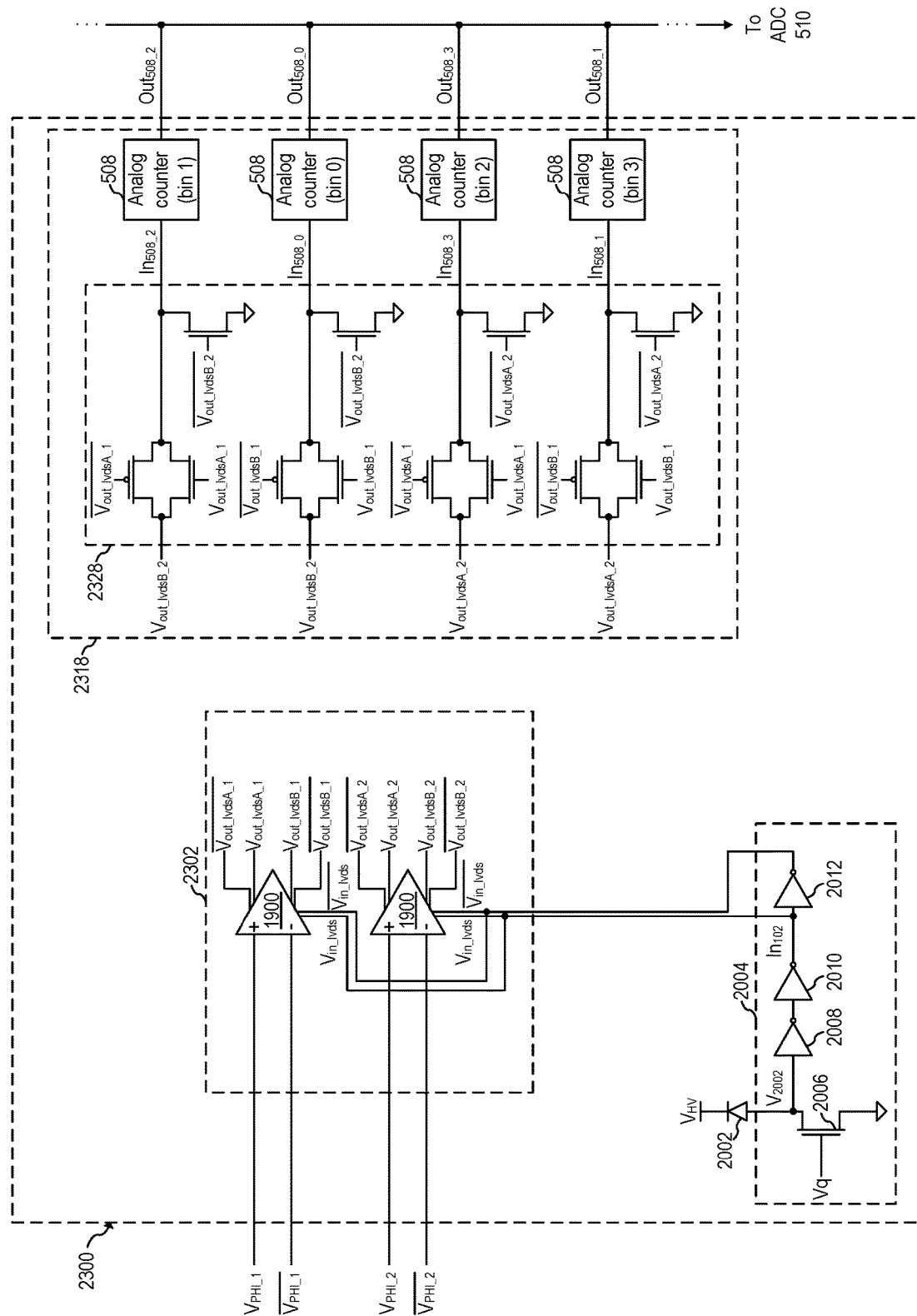
FIG. 23A shows a pixel, according to an embodiment of the present invention.

In some embodiments, ToF histograms with more than 2-bins may be implemented inside a pixel of a SPAD array. For example, For example, FIG. 23A shows pixel 2300, according to an embodiment of the present invention. Pixel 2300 includes SPAD 2002, SPAD front-end circuit 2004, TDC 2302, and histogram generation circuit 2318. TDC 2302 includes two LVDS latches 1900 receiving respective differential signals $V_{PHI_1}/\overline{V_{PHI1}}$ and $V_{PHI_2}/\overline{V_{PHI2}}$. Histogram generation circuit 2318 includes decoder 2328 and four analog counters 508. Decoder 928 may be implemented as decoder 2328. TDC 102 may be implemented as TDC 2302. SPAD array 2003 may be implemented with an array of pixels 2300.

FIG. 23B shows a timing diagram illustrating differential signals $V_{PHI_1}/\overline{V_{PHI1}}$ and $V_{PHI_2}/\overline{V_{PHI2}}$ received by pixel 2300, according to an embodiment of the present invention. FIGS. 23A and 23B may be understood together.

As illustrated in FIG. 23B, differential signals $V_{PHI_1}/\overline{V_{PHI1}}$ and $V_{PHI_2}/\overline{V_{PHI2}}$ may be out-of-phase.

As can be seen in FIGS. 23A and 23B, pixel 2300 is capable of generating a 4-bin ToF histogram. For example, when signal $In_{102}$ is pulsed, LVDS latches 1900 then asserts either output signal $V_{out\_lvdsA\_1}$ or output signal $V_{out\_lvdsB\_1}$ and either output signal $V_{out\_lvdsA\_2}$ or output signal $V_{out\_lvdsB\_2}$ depending on the state of input signals $V_{PHI_1}/\overline{V_{PHI1}}$ and $V_{PHI_2}/\overline{V_{PHI2}}$ at the time of the pulse of signal $In_{102}$. For example, when signal $V_{PHI_1}$ is lower than signal $\overline{V_{PHI1}}$ (illustrated as a 0 in FIG. 23B) and when signal $V_{PHI_2}$ is lower than signal $\overline{V_{PHI2}}$ (illustrated as a 0 in FIG. 23B), when signal $In_{102}$ is pulsed, then bin 0 is incremented. When signal $V_{PHI_1}$ is higher than signal $\overline{V_{PHI1}}$ and when signal $V_{PHI_2}$ is lower than signal $\overline{V_{PHI2}}$, when signal $In_{102}$ is pulsed, then bin 1 is incremented. When signal $V_{PHI_1}$ is higher than signal $\overline{V_{PHI1}}$ and when signal $V_{PHI_2}$ is higher than signal $\overline{V_{PHI2}}$, when signal $In_{102}$ is pulsed, then bin 2 is incremented. When signal $V_{PHI_1}$ is lower than signal $\overline{V_{PHI1}}$ and when signal $V_{PHI_2}$ is higher than signal $\overline{V_{PHI2}}$, when signal $In_{102}$ is pulsed, then bin 3 is incremented. In some embodiments, the bin sequence, with respect to the state of input signals $V_{PHI_1}/\overline{V_{PHI1}}$ and $V_{PHI_2}/\overline{V_{PHI2}}$, may be different.

In some embodiments, signal $CLK_{sample}$ may be transmitted from timing generation circuit 108 to LVDS latch 1900 of pixel 2000 as two low-voltage differential signals $V_{PHI_1}/\overline{V_{PHI1}}$ and $V_{PHI_2}/\overline{V_{PHI2}}$. Signals $V_{PHI_1}/\overline{V_{PHI1}}$ and $V_{PHI_2}/\overline{V_{PHI2}}$ may be implemented with a sinusoidal waveform. Other wave shapes, such as square waves, may also be used.

As shown in FIG. 23A, TDC 2302 is implemented with two LVDS latches 1900. In some embodiments, TDC 2302 may use other types of LVDS latches, such as LVDS latch 1800.

In some embodiments, the size of the bins 0, 1, 2, and 3 (e.g., the magnitude of the time period covered by each of bins 0, 1, 2, and 3) may be the same. In some embodiments the size of the bins 0, 1, 2, and 3, (e.g., the magnitude of the time period covered by each of bins 0, 1, 2, and 3) may be different. In some embodiments, one or more bins may be used for blanking. In some embodiments in which one or more bins are used for blanking, the corresponding analog counter 508 may be omitted.

In some embodiments, an LVDS latch (e.g., 1800, 1900) used as part of a TDC (e.g., 102, 2302) may be reused as a comparator (e.g., 938) for the ADC conversion. For example, FIG. 24A shows pixel 2400, according to an embodiment of the present invention. Pixel 2400 includes SPAD 2002, SPAD front-end circuit 2404, and TDC and histogram generation circuit 2418. TDC and histogram generation circuit 2418 includes LVDS latch 1800, self-reference control circuit 2412, two analog counters 508 (for bins 0, and 1, respectively), OR gates 2406, 2407, and 2410, switches 2420, 2422, 2424, 2426, 2428, 2430, 2432, 2434, 2436, 2438, and current source 2450. Pixel 2000 may be implemented as pixel 2400.

In some embodiments, OR gates 2406, 2408, and 2410 may be implemented outside pixel 2400, and the outputs of the OR gates (2406, 2408, and 2410) may be shared by multiple pixels (e.g., in a column). By implementing OR gates 2406, 2407, and 2410 outside pixel 2400, some embodiments, advantageously achieve smaller pixel size. By implementing OR gates 2406, 2407, and 2410 inside pixel 2400, some embodiments advantageously reduce the complexity of the routing effort.

In some embodiments, additional switches may be used to selectively connect the respective input of analog counters 508 to ground to avoid having a floating input when the respective switches (2438, 2436) is open.

FIG. 24B illustrates the state of switches 2420, 2422, 2424, 2426, 2428, 2430, 2432, 2434, 2436, 2438 for different modes of operation of pixel 2400, according to an embodiment of the present invention. FIGS. 24A and 24B may be understood together.

As can be seen in FIGS. 24A and 24B, pixel 2400 is capable of generating a 2-bin ToF histogram. For example, during integration mode (step 604), switches 2422, 2424, 2432, 2436, and 2438 are closed, and switches 2420, 2426, 2428, 2430, and 2434 are open, and pixel 2400 operates in a similar manner as pixel 2000. Thus, in some embodiments, LVDS latch 1800 operates as a TDC and as a decoder during the integration mode. In some embodiments, output $Out_{938}$ of self-reference control circuit 2412 may be tri-stated during the integration mode (step 604).

As can be seen in FIGS. 24A and 24B, during the conversion mode (606, 706) of either bin 0 or bin 1, LVDS latch 1800 operates as a comparator (e.g., 938) used to compare the output of the analog counter 508 (e.g., associated with bin 0, or bin 1) with reference voltage $V_{ref}$. For example, during conversion mode (606, 706) of bin 0, switches 2420, 2422, 2424, 2428, 2432, and 2436, are open and switches 2426, 2430, 2434, and 2438, are closed. As LVDS latch 1800 receives pulses from pulse generator 932 of ADC 910, output $V_{out\_lvdsA}$ pulses and output $Out_{508\_0}$ decreases. Once output $Out_{508\_0}$ reaches reference voltage $V_{ref}$, output $V_{out\_lvdsB}$ pulses, causing self-reference control circuit 2412 to assert (e.g., transition from high to low), thus causing AND gate 936 of ADC 910 to freeze, thus stopping counting of ripple counter 934.

Similarly, during conversion mode (606, 706) of bin 1, switches 2422, 2424, 2426, 2430, 2432, and 2438, are open and switches 2420, 2428, 2434, and 2436, are closed. As LVDS latch 1800 receives pulses from pulse generator 932 of ADC 910, output $V_{out\_lvdsB}$ pulses and output $Out_{508\_1}$ decreases. Once output $Out_{508\_1}$ reaches reference voltage $V_{ref}$, output $V_{out\_lvdsA}$ pulses, causing self-reference control circuit 2412 to assert (e.g., transition from high to low), thus causing AND gate 936 of ADC 910 to freeze, thus stopping counting of ripple counter 934.

As can be seen in FIGS. 24A and 24B, during integration mode, LVDS latch 1800 simultaneously operates as a TDC (e.g., 102) and as a decoder (e.g., 928). In some embodiments, pixel 2000 may use other types of LVDS latches, such as LVDS latch 1900 (e.g., by using front-end circuit 2004 and adding additional switches for the coupling of the output of inverter 2012 with the LVDS latch).

In some embodiments, one or more combinations of states of signals S1, S2, and S3 may be forbidden. For example, in some embodiments, only one of $S_1$, $S_2$ and $S_3$ may be "1" at the same time.

In some embodiments, signals $S_1$, $S_2$, and $S_3$ may be generated by a controller (e.g., controller 520) implemented inside pixel 2400 (not shown in FIG. 24A). In some embodiments, signals $S_1$, $S_2$, and $S_3$ may be generated by controller 930. Other implementations are also possible.

Figure 25:
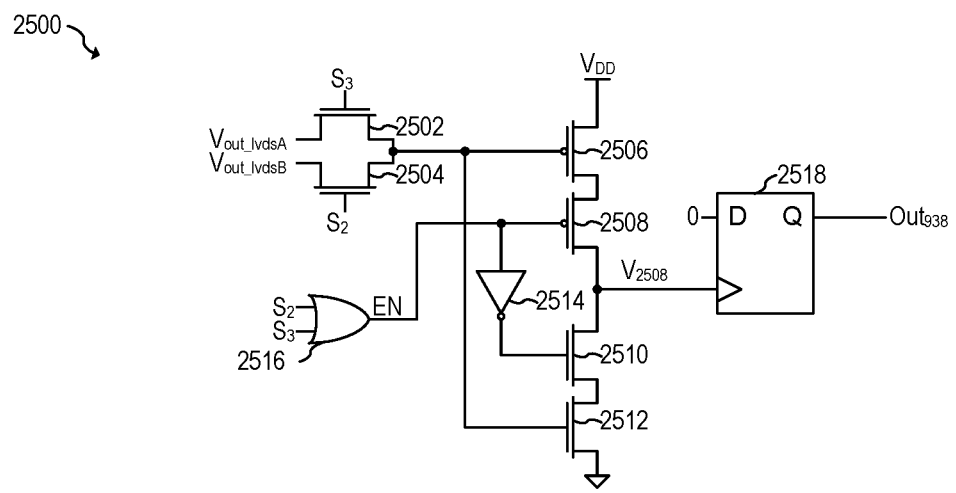
FIG. 25 shows the self-reference control circuit of FIG. 24A, according to an embodiment of the present invention.

FIG. 25 shows a self-reference control circuit 2500, according to an embodiment of the present invention. Self-reference control circuit 2412 may be implemented as self-reference control circuit 2500. FIG. 25 may be understood in view of FIGS. 24A and 24B.

As shown in FIG. 25, some embodiments may implement OR gate 2516 inside self-reference control circuit 2500 (and thus inside pixel 2400). In some embodiments, OR gate 2516 may be omitted and instead, the output of OR gate 2406 may be coupled to the gate of transistor 2508. In some embodiments, OR gate 2516 may be implemented outside pixel 2400, and the output of OR gate 2516 may be shared by multiple pixels (e.g., in a column).

As shown in FIG. 25, when signals S2 and S3 are both low, output $V_{2508}$ is in high-impedance mode. At the beginning of conversion (step 606, 706) of either bin 0 or bin 1, D-flip-flop 2518 is initialized with a "1". Thus, output $Out_{938}$ is high upon initialization of D-flip-flop 2418.

In some embodiments, D-flip-flop 2418 latches its D input during a falling transition of output $V_{2508}$.

During conversion (step 606, 706) of bin 0, switch $S_2$ is high and switch $S_3$ is low. Thus, transistors 2508 and 2510 are both on, transistor 2504 is on and transistor 2502 is off. As LVDS latch 1800 receives pulses from pulse generator 932 of ADC 910, output $V_{out\_lvdsA}$ pulses and output $Out_{508\_0}$ decreases while output $V_{out\_lvdsB}$ remains low. Thus, while output $Out_{508\_0}$ remains higher than reference voltage $V_{ref}$, transistor 2506 is on, transistor 2512 is off, and output $V_{2508}$ remains high. Once output $Out_{508\_0}$ reaches reference voltage $V_{ref}$, output $V_{out\_lvdsB}$ pulses, causing transistor 2506 to briefly turn off and transistor 2512 to briefly turn on, thus, causing output $V_{2508}$ to fall, thus latching a "0" into D-flip-flop 2518 and causing output Out938 to transition to a low state, thus stopping counting of ripple counter 934.

Similarly, during conversion (step 606, 706) of bin 1, switch $S_3$ is high and switch $S_2$ is low. Thus, transistors 2508 and 2510 are both on, transistor 2502 is on and transistor 2504 is off. As LVDS latch 1800 receives pulses from pulse generator 932 of ADC 910, output $V_{out\_lvdsB}$ pulses and output $Out_{508\_1}$ decreases while output $V_{out\_lvdsA}$ remains low. Thus, while output $Out_{508\_1}$ remains higher than reference voltage $V_{ref}$, transistor 2506 is on, transistor 2512 is off, and output $V_{2508}$ remains high. Once output $Out_{508\_1}$ reaches reference voltage $V_{ref}$, output $V_{out\_lvdsA}$ pulses, causing transistor 2506 to briefly turn off and transistor 2512 to briefly turn on, thus, causing output $V_{2508}$ to fall, thus latching a "0" into D-flip-flop 2518 and causing output Out938 to transition to a low state, thus stopping counting of ripple counter 934.

In some embodiments, D-flip-flop 2518 may be implemented as part of ADC 910.

Example embodiments of the present invention are summarized here. Other embodiments can also be understood from the entirety of the specification and the claims filed herein.

Example 1. A method including: resetting respective count values of a plurality of analog counters to an initial count value, each analog counter of the plurality of analog counters corresponding to a histogram bin of a time-of-flight (ToF) histogram; after resetting the respective count values of the plurality of analog counters, receiving a plurality of digital addresses from a time-to-digital converter (TDC), the TDC having an input coupled to a single photon avalanche diode (SPAD); during an integration period, for each received digital address of the plurality of digital addresses, selecting one analog counter of the plurality of analog counters based on the received digital address, and changing the respective count value of the selected one analog counter towards a second count value by a discrete amount, the second count value being different than the initial count value, where each analog counter has a final count value at an end of the integration period; and after the integration period, determining an associated final bin count of each histogram bin of the ToF histogram based on the final count value of the corresponding analog counter.

Example 2. The method of example 1, where the initial count value corresponds to a first voltage, where the second count value corresponds to a second voltage that is different than the first voltage, where resetting the respective count values of the plurality of analog counters includes resetting a voltage of an associated storage capacitor of each analog counter to the first voltage, and where changing the count value of the selected one analog counter includes changing the voltage of the associated storage capacitor by a discrete voltage towards the second voltage.

Example 3. The method of one of examples 1 or 2, where the first voltage corresponds to a full-scale voltage that is higher than the second voltage, and where changing the voltage of the associated storage capacitor by the discrete voltage towards the second voltage includes decreasing the voltage of the associated storage capacitor by the discrete voltage towards the second voltage.

Example 4. The method of one of examples 1 to 3, where the associated storage capacitor of each analog counter includes a metal-oxide semiconductor (MOS) capacitor or metal-oxide-metal (MOM) capacitor or a reverse bias diode.

Example 5. The method of one of examples 1 to 4, further including, after the integration period and during a signal conversion period, determining an associated remaining bin count of each histogram bin of the ToF histogram, where determining the associated remaining bin count of each histogram bin includes: providing a plurality of pulses to an input of each analog counter; and for each analog counter, counting an associated remaining number of pulses until the voltage of the associated storage capacitor reaches the second voltage, where the associated remaining bin count of each histogram bin is equal to the associated remaining number of pulses of the corresponding analog counter, where determining the associated final bin count of each histogram bin includes determining the associated final bin count of each histogram bin based on the associated remaining bin count.

Example 6. The method of one of examples 1 to 5, further including, after the signal conversion period, resetting the voltage of the storage capacitor of each analog counter to the first voltage, and determining an associated full-scale bin count for each histogram bin, where determining the associated full-scale bin count for each histogram bin includes: providing a plurality of pulses to the input of each analog counter; and for each analog counter, counting an associated total number of pulses until the voltage of the associated storage capacitor reaches the second voltage from the first voltage, where the associated full-scale bin count of each histogram bin is equal to the associated total number of pulses of the corresponding analog counter, and where determining the associated final bin count of each histogram bin is further based on the associated full-scale bin count.

Example 7. The method of one of examples 1 to 6, where a ripple counter is used for counting each of the associated remaining number of pulses and each of the associated total number of pulses, and where determining the associated final bin count of each histogram bin includes: latching the associated remaining bin count into a count latch; and using an adder to subtract a content of the count latch from an output of the ripple counter to obtain the associated final bin count.

Example 8. The method of one of examples 1 to 7, where each of the plurality of digital addresses includes m bits, m being a positive integer greater than or equal to 1, where the plurality of analog counters includes n analog counters, n being equal to $2^m$, and where selecting the one analog counter includes using a decoder having n outputs respectively coupled to the n analog counters, and a decoder input for receiving the plurality of digital addresses.

Example 9. The method of one of examples 1 to 8, where the decoder includes a low-voltage digital signal (LVDS) latch.

Example 10. The method of one of examples 1 to 9, where the decoder input is coupled to an output of a low-voltage digital signal (LVDS) latch.

Example 11. The method of one of examples 1 to 10, where m is equal to 1 and n is equal to 2.

Example 12. The method of one of examples 1 to 11, where the TDC includes a low-voltage digital signal (LVDS) latch.

Example 13. The method of one of examples 1 to 12, where the each of the plurality of digital addresses includes 1-bit, where the plurality of analog counters includes first and second analog counters, and where the LVDS latch includes a first output coupled to the first analog counter and a second output coupled to the second analog counter.

Example 14. A time-of-flight (ToF) system including: a plurality of single photon avalanche diodes (SPADs) configured to generate SPAD events; a plurality of time-to-digital converters (TDCs) coupled to the plurality of SPADs, where each TDC of the plurality of TDCs is configured to generate digital addresses based on SPAD events generated by an associated SPAD of the plurality of SPADs; a plurality of histogram generation circuits, each histogram generation circuit of the plurality of histogram generation circuits coupled to a respective TDC of the plurality of TDCs, where each histogram generation circuit includes: an addressing logic circuit having a plurality of outputs, and an input configured to receive digital addresses from the respective TDC, a plurality of analog counters, where each analog counter of the plurality of analog counters includes an input coupled to a respective output of the plurality of outputs of the addressing logic circuit, where each analog counter includes an associated storage capacitor; and an analog-to-digital converter (ADC) coupled to the plurality of analog counters, where: each histogram generation circuit is configured to reset a voltage of the associated storage capacitor of each analog counter to a first voltage, the addressing logic circuit is configured to, during an integration period after the resetting of the plurality of analog counters, select, for each received digital address, one analog counter of the plurality of analog counters based on the received digital address, and assert the input of the selected one analog counter, where the selected one analog counter is configured to change a voltage of the associated storage capacitor of the selected one analog counter towards a second voltage by a discrete voltage when the input of the selected one analog counter is asserted, where the associated storage capacitor of each analog counter is configured to have a final voltage at an end of the integration period, and the ADC is configured to convert the final voltage of the associated storage capacitor of each analog counter to a corresponding digital count, where each digital count is associated with a histogram bin of a ToF histogram, and where an associated final bin count of each histogram bin of the ToF histogram is based on the associated digital count.

Example 15. The ToF system of example 14, where the first voltage is higher than the second voltage.

Example 16. The ToF system of one of examples 14 or 15, where each analog counter includes: a charge transfer amplifier including the associated storage capacitor and having an input coupled to the input of the analog counter; and a readout circuit having an input coupled to an output of the charge transfer amplifier and to the associated storage capacitor, and an output coupled to the ADC.

Example 17. The ToF system of one of examples 14 to 16, where each storage capacitor includes a metal-oxide semiconductor (MOS) capacitor or metal-oxide-metal (MOM) capacitor or a reverse bias diode.

Example 18. The ToF system of one of examples 14 to 17, where the charge transfer amplifier includes: an input transistor having a control terminal coupled to the input of the analog counter and a current path coupled to the output of the charge transfer amplifier; a reset transistor having a current path coupled between the output of the charge transfer amplifier and a first supply terminal; and a first transistor having a current path coupled between the current path of the input transistor and a second supply terminal.

Example 19. The ToF system of one of examples 14 to 18, where the reset transistor includes a bulk terminal that is coupled to a third supply terminal that is different from the first supply terminal.

Example 20. The ToF system of one of examples 14 to 19, where each of the digital addresses includes m bits, m being a positive integer greater than or equal to 1, where the plurality of analog counters includes n analog counters, n being equal to $2^m$, where the addressing logic circuit includes a decoder having n outputs, and where each histogram generation circuit further includes: n first logic gates, each of the n first logic gates having a first input respectively coupled to the n outputs of the decoder; and a pulse control circuit having an output coupled to a second input of each of the n first logic gates.

Example 21. The ToF system of one of examples 14 to 20, where the ADC includes: a comparator having a first input coupled to an analog counter of the n analog counters, and a second input configured to receive the second voltage; a pulse generator configured to pulse the input of each of the plurality of analog counters during a signal conversion period; and a ripple counter having an input coupled to an output of the comparator.

Example 22. The ToF system of one of examples 14 to 21, where the comparator is disposed inside a SPAD pixel of a SPAD array.

Example 23. The ToF system of one of examples 14 to 22, further including a timing generation circuit configured to provide m out-of-phase clock signals to the plurality of TDCs and a trigger signal to an illumination source, where each TDC is configured to generate the digital addresses based on the m out-of-phase clock signals.

Example 24. The ToF system of one of examples 14 to 23, where the m out-of-phase clock signals are m differential out-of-phase clock signals, and where each TDC includes m low-voltage digital signal (LVDS) latches, each of the m LVDS latches having a differential clock input configured to receive a respective differential out-of-phase clock signal of the m differential out-of-phase clock signals, and a latch input configured to receive SPAD events.

Example 25. The ToF system of one of examples 14 to 24, further including a SPAD array including an array of pixels including the plurality of SPADs, where each pixel of the SPAD array including a SPAD of the plurality of SPADs and a SPAD front-end circuit.

Example 26. The ToF system of one of examples 14 to 25, where the ADC is configured to, during a signal conversion period, provide a plurality of pulses to the input of each analog counter, and for each analog counter, count an associated remaining number of pulses until the voltage of the associated storage capacitor reaches the second voltage, where the ADC is configured to convert the final voltage of the associated storage capacitor of each analog counter to the corresponding digital count based on the count of the associated remaining number of pulses of the respective analog counter.

Example 27. The ToF system of one of examples 14 to 26, where each histogram generation circuit is configured to reset the voltage of the associated storage capacitor of each analog counter to the first voltage after the signal conversion period, and where the ADC is configured to, during a full-scale conversion period, provide a plurality of pulses to the input of each analog counter, and for each analog counter, count a full-scale number of pulses until the voltage of the associated storage capacitor reaches the second voltage from the first voltage, where the ADC is configured to convert the final voltage of the associated storage capacitor of each analog counter to the corresponding digital count based on the count of the full-scale number of pulses of the respective analog counter.

Example 28. A time-of-flight (ToF) system including: a single photon avalanche diodes (SPAD) array including an array of pixels, each pixel of the array of pixels including a SPAD and a SPAD front-end circuit; a plurality of time-to-digital converters (TDCs) coupled to respective SPADs of the SPAD array, where each TDC of the plurality of TDCs is configured to generate digital addresses based on SPAD events generated by the respective SPAD, where each digital address of the digital addresses includes m bits, m being a positive integer greater than or equal to 1; a plurality of histogram generation circuits, each histogram generation circuit of the plurality of histogram generation circuits including: an addressing logic circuit having n outputs, and an input configured to receive digital addresses from the respective TDC, n analog counters, n being equal to $2^m$, where each analog counter of the n analog counters includes an input coupled to a respective output of the n outputs of the addressing logic circuit, where each analog counter includes an associated storage capacitor, n first logic gates, each of the n first logic gates having a first input respectively coupled to the n outputs of the addressing logic circuit, and a pulse control circuit having an output coupled to a second input of each of the n first logic gates; and an analog-to-digital converter (ADC) coupled to the n of analog counters.

Example 29. The ToF system of example 28, where the ADC includes: a comparator having a first input coupled to a first analog counter of the n analog counters, and a second input configured to receive a reference voltage; a pulse generator having an output coupled to an input of the first analog counter; and a ripple counter having an input coupled to an output of the comparator.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
    resetting respective count values of a plurality of analog counters to an initial count value, each analog counter of the plurality of analog counters corresponding to a histogram bin of a time-of-flight (ToF) histogram;
    after resetting the respective count values of the plurality of analog counters, receiving a plurality of digital addresses from a time-to-digital converter (TDC), the TDC having an input coupled to a single photon avalanche diode (SPAD);
    during an integration period, for each received digital address of the plurality of digital addresses, selecting one analog counter of the plurality of analog counters based on the received digital address, and changing the respective count value of the selected one analog counter towards a second count value by a discrete amount, the second count value being different than the initial count value, wherein each analog counter has a final count value at an end of the integration period; and
    after the integration period, determining an associated final bin count of each histogram bin of the ToF histogram based on the final count value of the corresponding analog counter.

2. The method of claim 1, wherein the initial count value corresponds to a first voltage, wherein the second count value corresponds to a second voltage that is different than the first voltage, wherein resetting the respective count values of the plurality of analog counters comprises resetting a voltage of an associated storage capacitor of each analog counter to the first voltage, and wherein changing the count value of the selected one analog counter comprises changing the voltage of the associated storage capacitor by a discrete voltage towards the second voltage.

3. The method of claim 2, wherein the first voltage corresponds to a full-scale voltage that is higher than the second voltage, and wherein changing the voltage of the associated storage capacitor by the discrete voltage towards the second voltage comprises decreasing the voltage of the associated storage capacitor by the discrete voltage towards the second voltage.

4. The method of claim 2, further comprising, after the integration period and during a signal conversion period, determining an associated remaining bin count of each histogram bin of the ToF histogram, wherein determining the associated remaining bin count of each histogram bin comprises:
    providing a plurality of pulses to an input of each analog counter; and
    for each analog counter, counting an associated remaining number of pulses until the voltage of the associated storage capacitor reaches the second voltage, wherein the associated remaining bin count of each histogram bin is equal to the associated remaining number of pulses of the corresponding analog counter, wherein determining the associated final bin count of each histogram bin comprises determining the associated final bin count of each histogram bin based on the associated remaining bin count.

5. The method of claim 4, further comprising, after the signal conversion period, resetting the voltage of the storage capacitor of each analog counter to the first voltage, and determining an associated full-scale bin count for each histogram bin, wherein determining the associated full-scale bin count for each histogram bin comprises:
   providing a plurality of pulses to the input of each analog counter; and
   for each analog counter, counting an associated total number of pulses until the voltage of the associated storage capacitor reaches the second voltage from the first voltage, wherein the associated full-scale bin count of each histogram bin is equal to the associated total number of pulses of the corresponding analog counter, and wherein determining the associated final bin count of each histogram bin is further based on the associated full-scale bin count.

6. The method of claim 5, wherein a ripple counter is used for counting each of the associated remaining number of pulses and each of the associated total number of pulses, and wherein determining the associated final bin count of each histogram bin comprises:
   latching the associated remaining bin count into a count latch; and
   using an adder to subtract a content of the count latch from an output of the ripple counter to obtain the associated final bin count.

7. The method of claim 1, wherein each of the plurality of digital addresses comprises m bits, m being a positive integer greater than or equal to 1, wherein the plurality of analog counters comprises n analog counters, n being equal to $2^m$, and wherein selecting the one analog counter comprises using a decoder having n outputs respectively coupled to the n analog counters, and a decoder input for receiving the plurality of digital addresses.

8. The method of claim 7, wherein the decoder comprises a low-voltage digital signal (LVDS) latch.

9. The method of claim 7, wherein the decoder input is coupled to an output of a low-voltage digital signal (LVDS) latch.

10. The method of claim 7, wherein m is equal to 1 and n is equal to 2.

11. The method of claim 1, wherein the TDC comprises a low-voltage digital signal (LVDS) latch.

12. The method of claim 11, wherein the each of the plurality of digital addresses comprises 1-bit, wherein the plurality of analog counters comprises first and second analog counters, and wherein the LVDS latch comprises a first output coupled to the first analog counter and a second output coupled to the second analog counter.

13. A time-of-flight (ToF) system comprising:
   a plurality of single photon avalanche diodes (SPADs) configured to generate SPAD events;
   a plurality of time-to-digital converters (TDCs) coupled to the plurality of SPADs, wherein each TDC of the plurality of TDCs is configured to generate digital addresses based on SPAD events generated by an associated SPAD of the plurality of SPADs;
   a plurality of histogram generation circuits, each histogram generation circuit of the plurality of histogram generation circuits coupled to a respective TDC of the plurality of TDCs, wherein each histogram generation circuit comprises:
      an addressing logic circuit having a plurality of outputs, and an input configured to receive digital addresses from the respective TDC,
      a plurality of analog counters, wherein each analog counter of the plurality of analog counters comprises an input coupled to a respective output of the plurality of outputs of the addressing logic circuit, wherein each analog counter comprises an associated storage capacitor; and
   an analog-to-digital converter (ADC) coupled to the plurality of analog counters, wherein:
      each histogram generation circuit is configured to reset a voltage of the associated storage capacitor of each analog counter to a first voltage,
      the addressing logic circuit is configured to, during an integration period after the resetting of the plurality of analog counters, select, for each received digital address, one analog counter of the plurality of analog counters based on the received digital address, and assert the input of the selected one analog counter, wherein the selected one analog counter is configured to change a voltage of the associated storage capacitor of the selected one analog counter towards a second voltage by a discrete voltage when the input of the selected one analog counter is asserted, wherein the associated storage capacitor of each analog counter is configured to have a final voltage at an end of the integration period, and
      the ADC is configured to convert the final voltage of the associated storage capacitor of each analog counter to a corresponding digital count, wherein each digital count is associated with a histogram bin of a ToF histogram, and wherein an associated final bin count of each histogram bin of the ToF histogram is based on the associated digital count.

14. The ToF system of claim 13, wherein the first voltage is higher than the second voltage.

15. The ToF system of claim 13, wherein each analog counter comprises:
   a charge transfer amplifier comprising the associated storage capacitor and having an input coupled to the input of the analog counter; and
   a readout circuit having an input coupled to an output of the charge transfer amplifier and to the associated storage capacitor, and an output coupled to the ADC.

16. The ToF system of claim 15, wherein each storage capacitor comprises a metal-oxide semiconductor (MOS) capacitor or metal-oxide-metal (MOM) capacitor or a reverse bias diode.

17. The ToF system of claim 15, wherein the charge transfer amplifier comprises:
   an input transistor having a control terminal coupled to the input of the analog counter and a current path coupled to the output of the charge transfer amplifier;
   a reset transistor having a current path coupled between the output of the charge transfer amplifier and a first supply terminal; and
   a first transistor having a current path coupled between the current path of the input transistor and a second supply terminal.

18. The ToF system of claim 17, wherein the reset transistor comprises a bulk terminal that is coupled to a third supply terminal that is different from the first supply terminal.

19. The ToF system of claim 13, wherein each of the digital addresses comprises m bits, m being a positive integer greater than or equal to 1, wherein the plurality of analog counters comprises n analog counters, n being equal to $2^m$, wherein the addressing logic circuit comprises a decoder having n outputs, and wherein each histogram generation circuit further comprises:
n first logic gates, each of the n first logic gates having a first input respectively coupled to the n outputs of the decoder; and
a pulse control circuit having an output coupled to a second input of each of the n first logic gates.

20. The ToF system of claim 19, wherein the ADC comprises:
a comparator having a first input coupled to an analog counter of the n analog counters, and a second input configured to receive the second voltage;
a pulse generator configured to pulse the input of each of the plurality of analog counters during a signal conversion period; and
a ripple counter having an input coupled to an output of the comparator.

21. The ToF system of claim 20, wherein the comparator is disposed inside a SPAD pixel of a SPAD array.

22. The ToF system of claim 19, further comprising a timing generation circuit configured to provide m out-of-phase clock signals to the plurality of TDCs and a trigger signal to an illumination source, wherein each TDC is configured to generate the digital addresses based on the m out-of-phase clock signals.

23. The ToF system of claim 22, wherein the m out-of-phase clock signals are m differential out-of-phase clock signals, and wherein each TDC comprises m low-voltage digital signal (LVDS) latches, each of the m LVDS latches having a differential clock input configured to receive a respective differential out-of-phase clock signal of the m differential out-of-phase clock signals, and a latch input configured to receive SPAD events.

24. The ToF system of claim 13, further comprising a SPAD array comprising an array of pixels comprising the plurality of SPADs, wherein each pixel of the SPAD array comprising a SPAD of the plurality of SPADs and a SPAD front-end circuit.

25. The ToF system of claim 13, wherein the ADC is configured to, during a signal conversion period, provide a plurality of pulses to the input of each analog counter, and for each analog counter, count an associated remaining number of pulses until the voltage of the associated storage capacitor reaches the second voltage, wherein the ADC is configured to convert the final voltage of the associated storage capacitor of each analog counter to the corresponding digital count based on the count of the associated remaining number of pulses of the respective analog counter.

26. The ToF system of claim 25, wherein each histogram generation circuit is configured to reset the voltage of the associated storage capacitor of each analog counter to the first voltage after the signal conversion period, and wherein the ADC is configured to, during a full-scale conversion period, provide a plurality of pulses to the input of each analog counter, and for each analog counter, count a full-scale number of pulses until the voltage of the associated storage capacitor reaches the second voltage from the first voltage, wherein the ADC is configured to convert the final voltage of the associated storage capacitor of each analog counter to the corresponding digital count based on the count of the full-scale number of pulses of the respective analog counter.

27. A time-of-flight (ToF) system comprising:
a single photon avalanche diodes (SPAD) array comprising an array of pixels, each pixel of the array of pixels comprising a SPAD and a SPAD front-end circuit;
a plurality of time-to-digital converters (TDCs) coupled to respective SPADs of the SPAD array, wherein each TDC of the plurality of TDCs is configured to generate digital addresses based on SPAD events generated by the respective SPAD, wherein each digital address of the digital addresses comprises m bits, m being a positive integer greater than or equal to 1;
a plurality of histogram generation circuits, each histogram generation circuit of the plurality of histogram generation circuits comprising:
an addressing logic circuit having n outputs, and an input configured to receive digital addresses from the respective TDC,
n analog counters, n being equal to $2^m$, wherein each analog counter of the n analog counters comprises an input coupled to a respective output of the n outputs of the addressing logic circuit, wherein each analog counter comprises an associated storage capacitor,
n first logic gates, each of the n first logic gates having a first input respectively coupled to the n outputs of the addressing logic circuit, and
a pulse control circuit having an output coupled to a second input of each of the n first logic gates; and
an analog-to-digital converter (ADC) coupled to the n of analog counters.

28. The ToF system of claim 27, wherein the ADC comprises:
a comparator having a first input coupled to a first analog counter of the n analog counters, and a second input configured to receive a reference voltage;
a pulse generator having an output coupled to an input of the first analog counter; and
a ripple counter having an input coupled to an output of the comparator.

* * * * *